(12) United States Patent
Kikuchi

(10) Patent No.: US 10,594,108 B2
(45) Date of Patent: Mar. 17, 2020

(54) MULTIMODE INTERFERENCE DEVICE, MACH-ZEHNDER MODULATION DEVICE

(71) Applicant: SUMITOMO ELECTRIC INDUSTRIES, LTD., Osaka (JP)

(72) Inventor: Takehiko Kikuchi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/206,391

(22) Filed: Nov. 30, 2018

(65) Prior Publication Data

US 2019/0173261 A1 Jun. 6, 2019

(30) Foreign Application Priority Data

Dec. 1, 2017 (JP) ................. 2017-231777

(51) Int. Cl.
| | |
|---|---|
| *H01S 5/026* | (2006.01) |
| *G02F 1/025* | (2006.01) |
| *H01S 5/227* | (2006.01) |
| *H01S 5/12* | (2006.01) |
| *G02F 1/225* | (2006.01) |
| *G02F 1/313* | (2006.01) |

(52) U.S. Cl.
CPC ............ *H01S 5/0265* (2013.01); *G02F 1/025* (2013.01); *G02F 1/2257* (2013.01); *G02F 1/3136* (2013.01); *H01S 5/12* (2013.01); *H01S 5/227* (2013.01)

(58) Field of Classification Search
CPC .......... H01S 5/0265; H01S 5/12; H01S 5/227; G02F 1/025; G02F 1/2257
See application file for complete search history.

(56) References Cited

U.S. PATENT DOCUMENTS

| | | | | |
|---|---|---|---|---|
| 2012/0243824 A1* | 9/2012 | Takabayashi | ..... | H01L 31/03046 385/14 |
| 2014/0241659 A1* | 8/2014 | Fukuda | ................. | G02F 1/0121 385/3 |
| 2015/0331298 A1* | 11/2015 | Yagi | ...................... | G02F 1/2255 385/2 |

(Continued)

FOREIGN PATENT DOCUMENTS

JP 2012-252290 12/2012

*Primary Examiner* — Seahvosh Nikmanesh
(74) *Attorney, Agent, or Firm* — Smith, Gambrell & Russell, LLP.

(57) ABSTRACT

A multimode interference device includes: man MMI semiconductor mesa having first and second end faces that are arranged in a direction of a first axis, and first and second side faces that extend in the direction of the first axis; first and second semiconductor mesas disposed apart from the first and second side faces, respectively; an embedding region covering the MMI semiconductor mesa and the first and second semiconductor mesas and having first and second openings at the first and second semiconductor mess, respectively; and first and second metal bodies making contact with the first and second semiconductor mesas through the first and second openings, respectively. The first and second end faces have multiple first ports and multiple second ports, respectively. The first semiconductor mesa, the MMI semiconductor mesa, and the second semiconductor mesa are arranged in a direction of a second axis intersecting the first axis.

7 Claims, 13 Drawing Sheets

(56) References Cited

U.S. PATENT DOCUMENTS

| | | | |
|---|---|---|---|
| 2016/0119064 A1* | 4/2016 | Yamaji | H04B 10/67 398/214 |
| 2017/0285438 A1* | 10/2017 | Goto | G02F 1/2257 |
| 2018/0373114 A1* | 12/2018 | Tanaka | G02F 1/225 |
| 2019/0072834 A1* | 3/2019 | Kono | G02F 1/2257 |

* cited by examiner

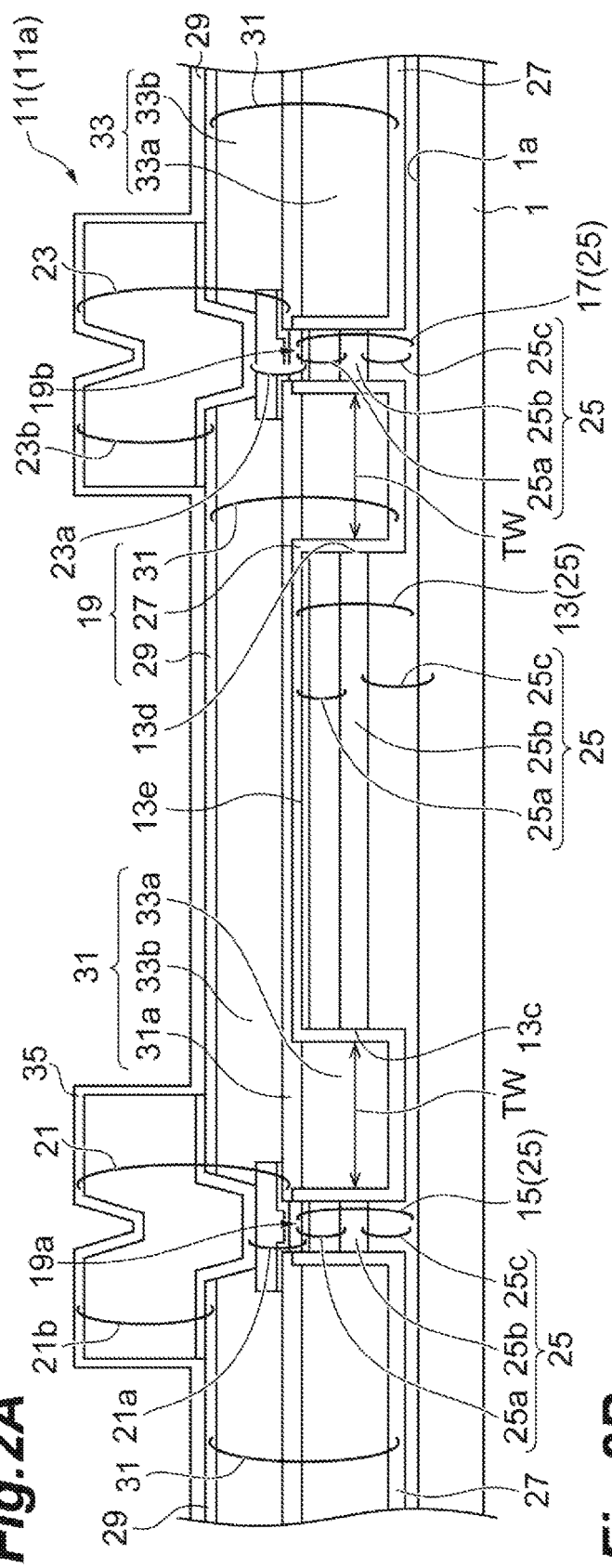
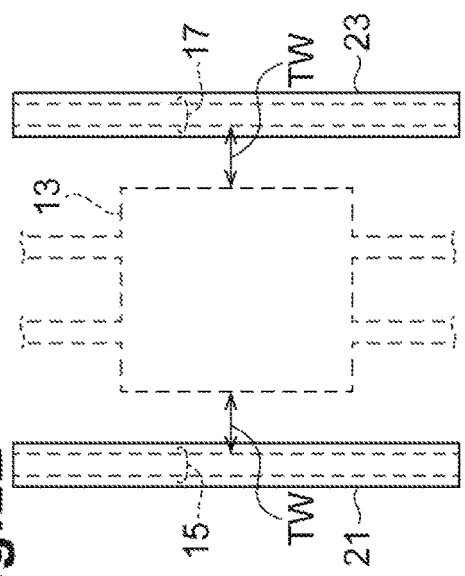

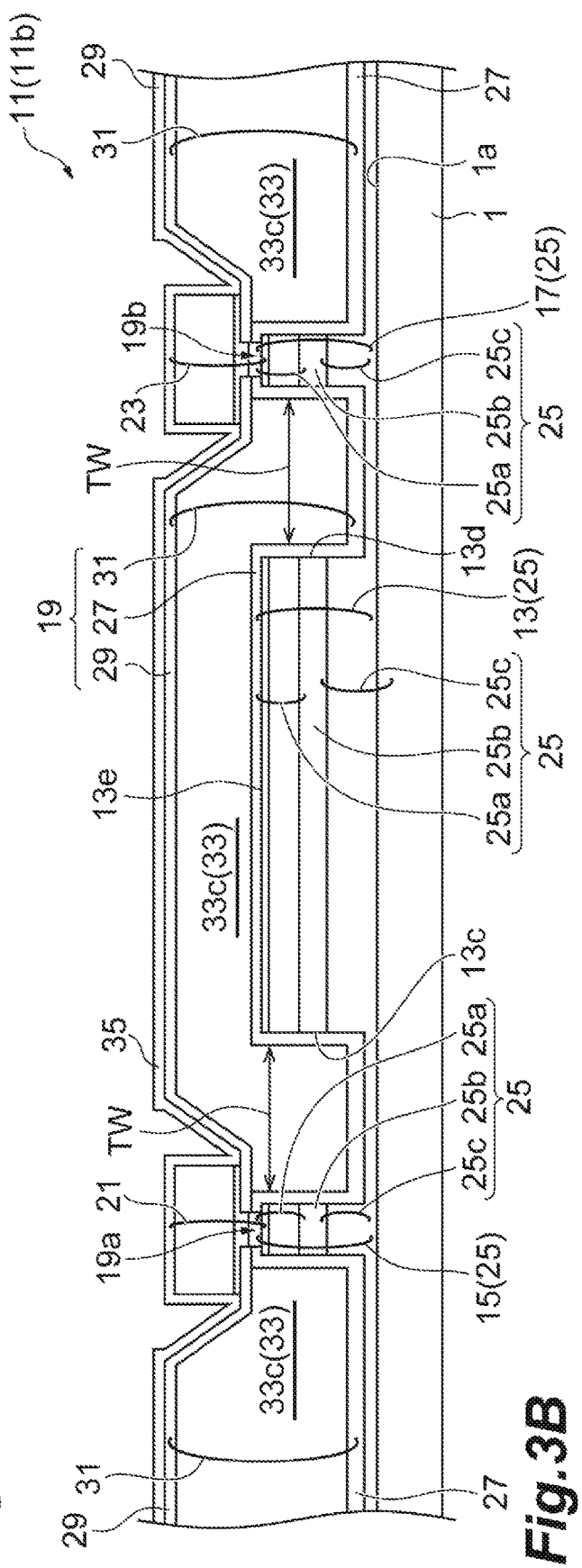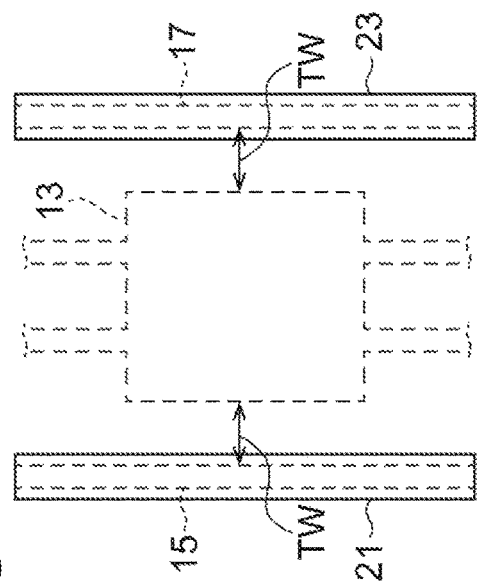

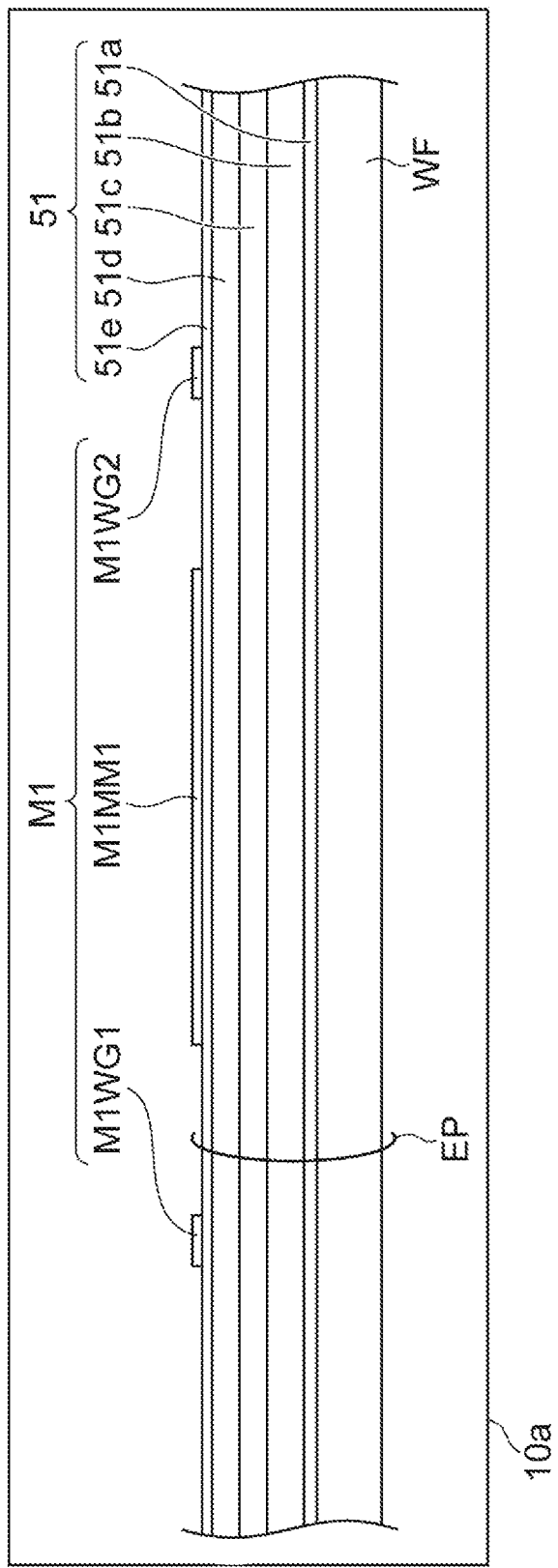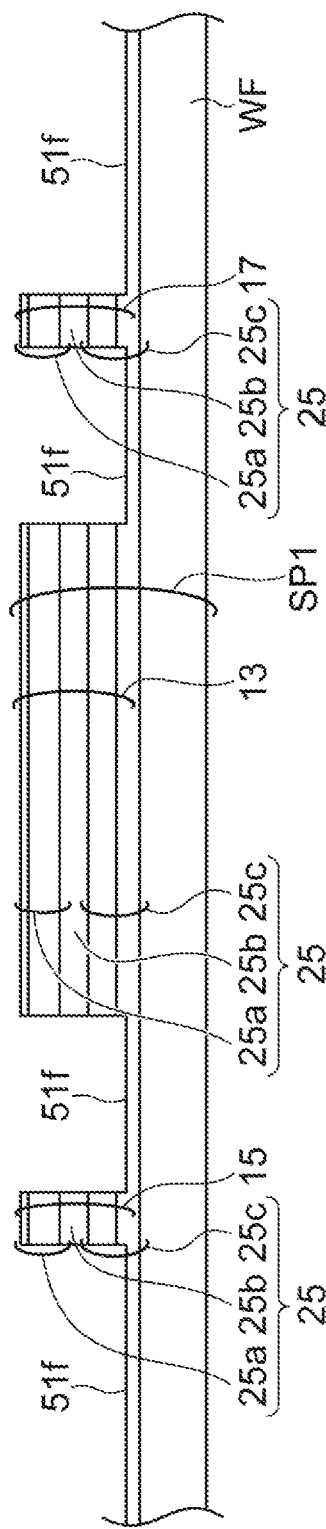

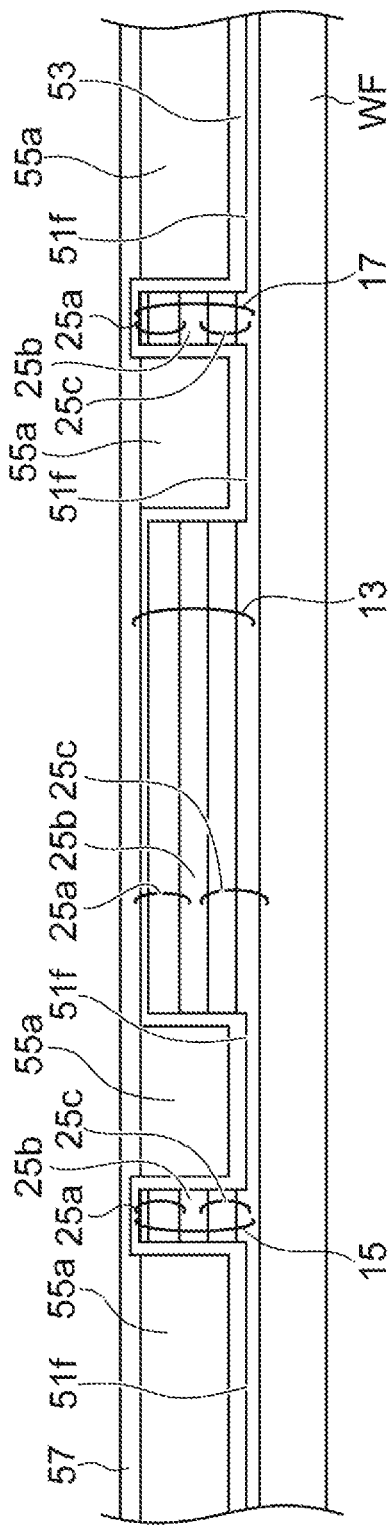
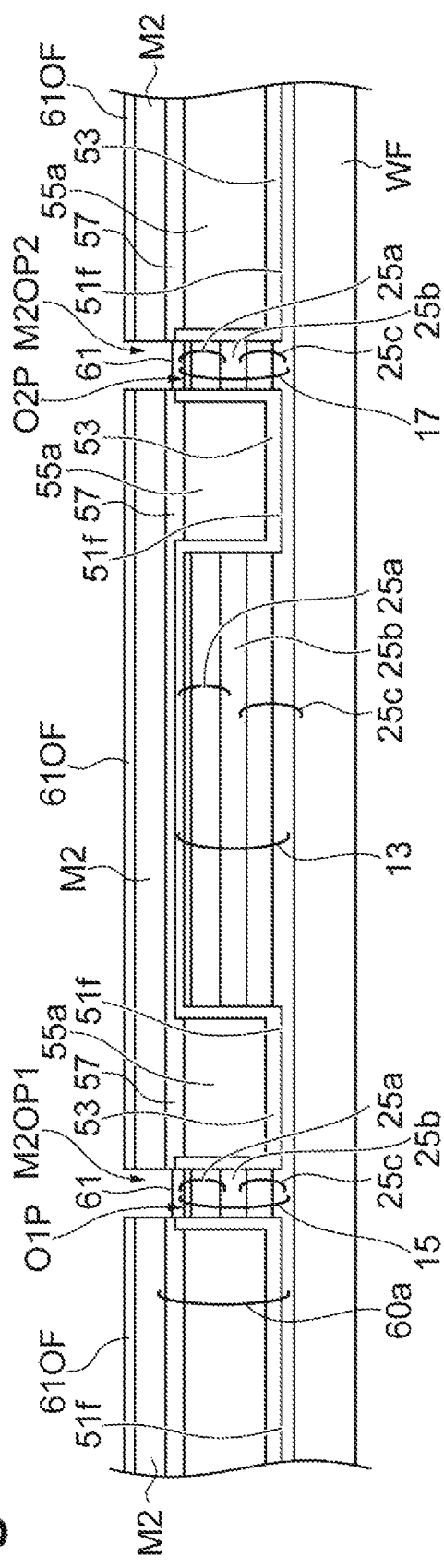

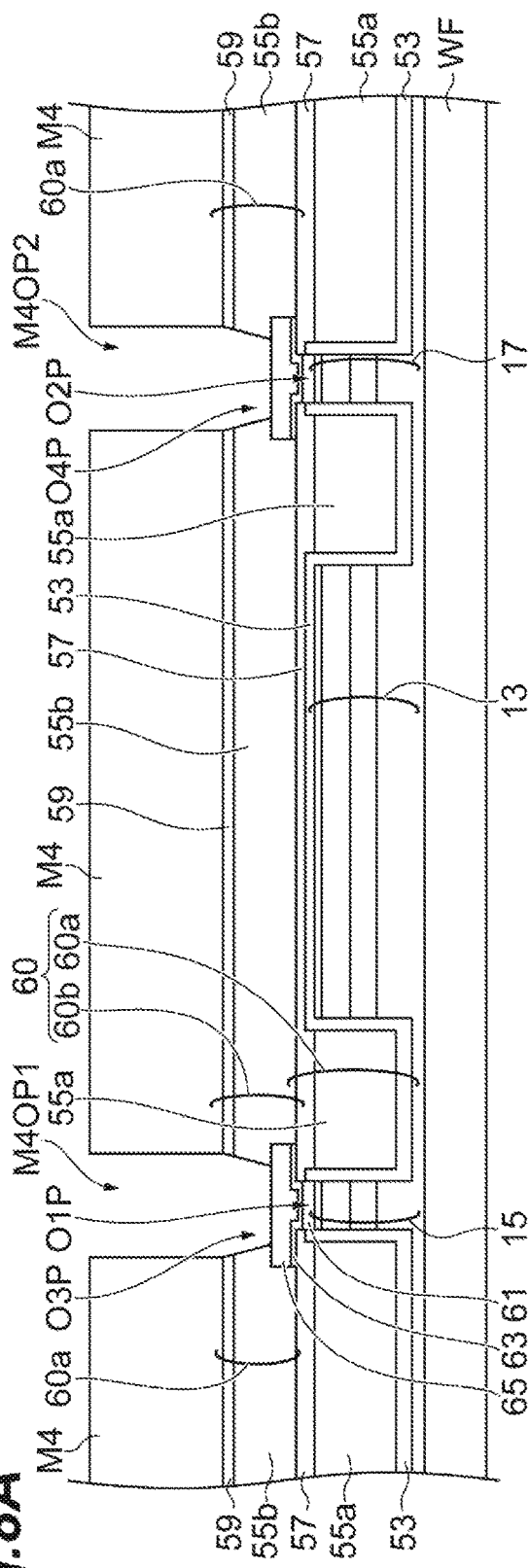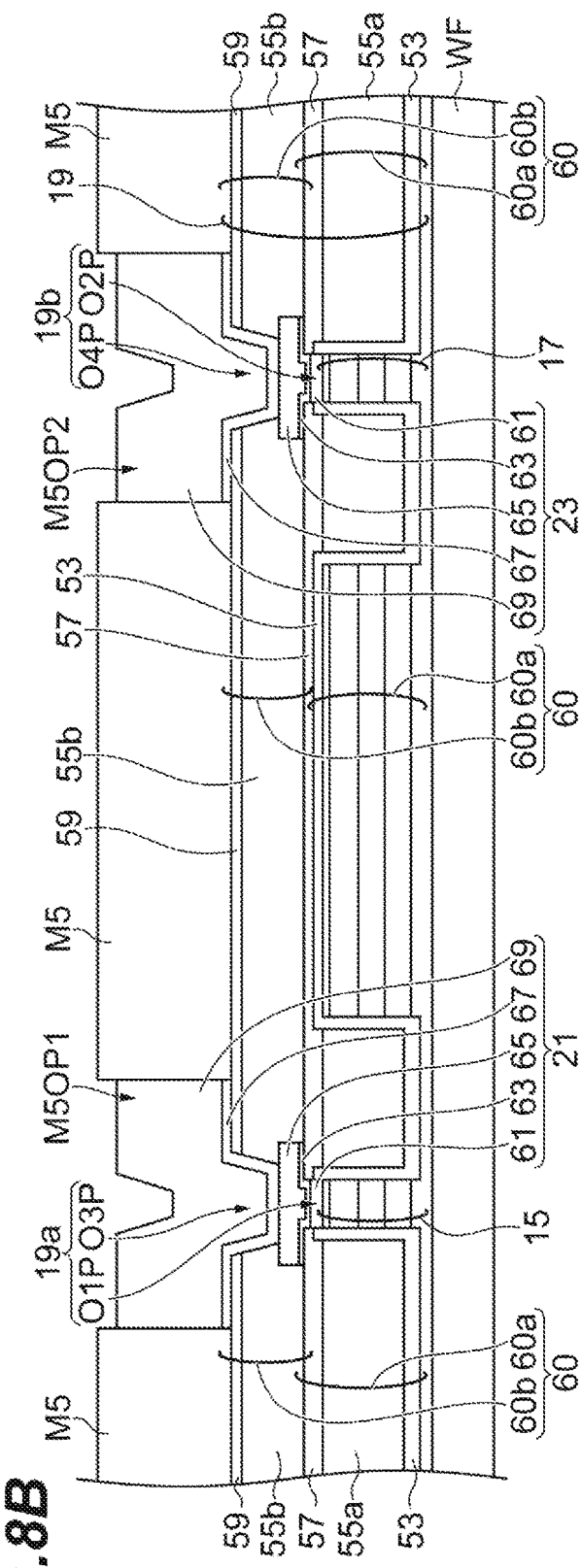

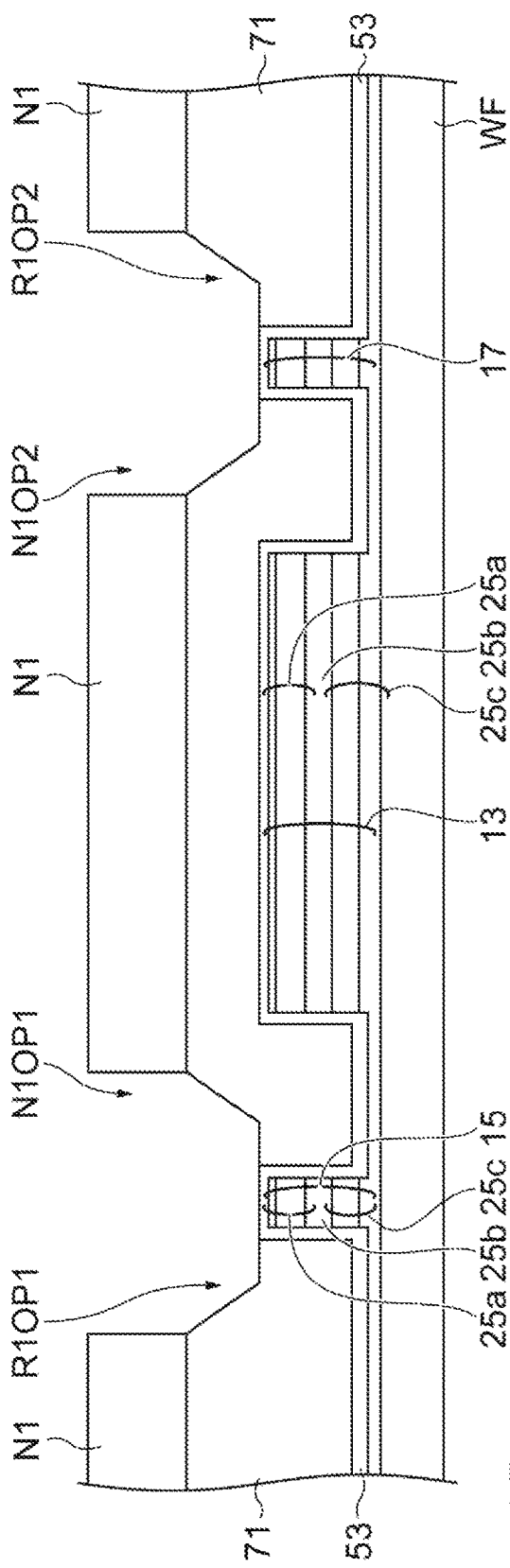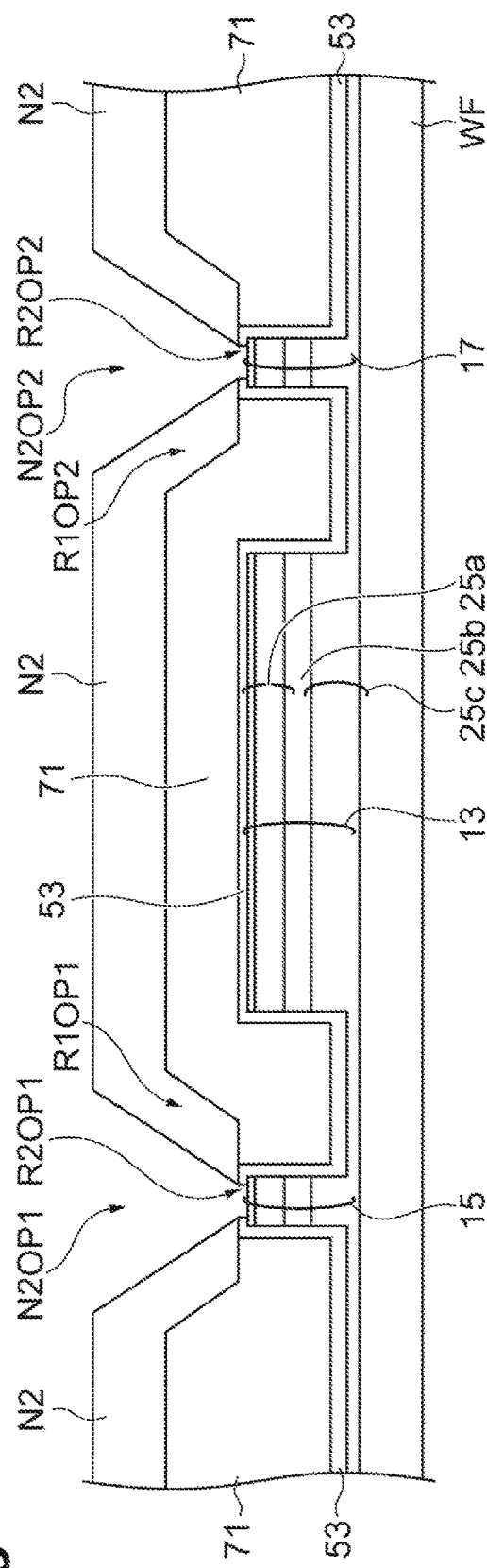

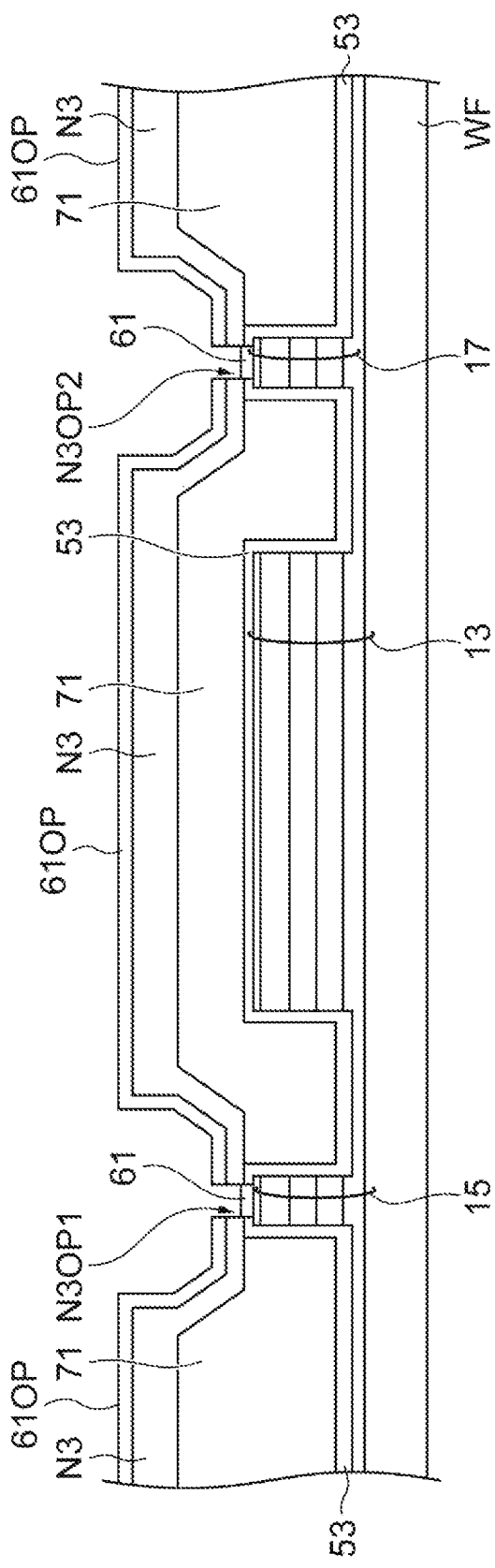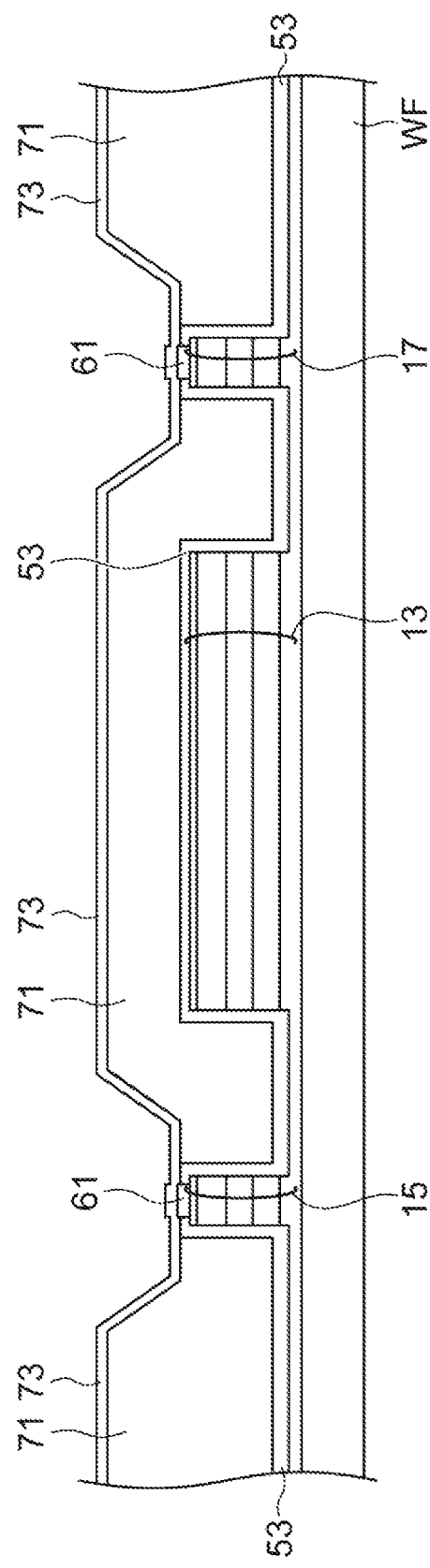

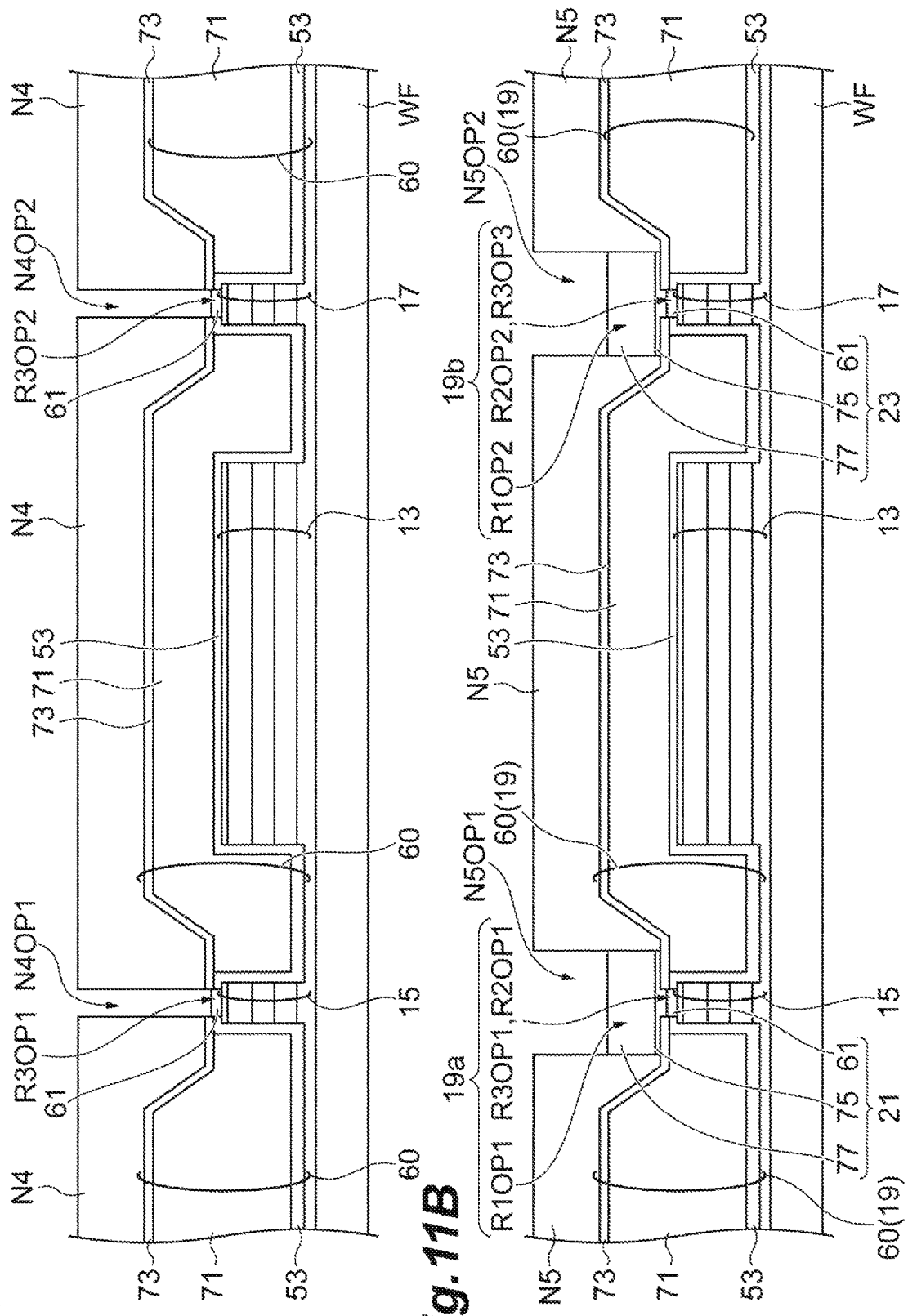

MULTIMODE INTERFERENCE DEVICE, MACH-ZEHNDER MODULATION DEVICE

BACKGROUND OF THE INVENTION

Field of the Invention

The present invention relates to a multimode interference device and a monolithically integrated Mach-Zehnder modulation device. This application claims the benefit of priority from Japanese Patent application No. 2017-231777 filed on Dec. 1, 2017, which is herein incorporated by reference in its entirety.

Related Background Art

Patent Document 1, referred to as Japanese Unexamined Patent Application Publication No. 2012-252290, discloses an optical waveguide element.

SUMMARY OF THE INVENTION

Multimode interferometers (MMIs) can be provided with various structures, such as 1×2 MMI, 2×1 MMI, and 2×2 MMI, in terms of the numbers of input and output ports. A multimode interferometer with multiple input ports and multiple output ports, such as 2×2 MMI, operates as follows: the multimode interferometer enables multiple interference to divide light incident on one input port among the input ports into the multiple output ports and to divide light incident on another input port among the input ports into the multiple output ports. The multimode interferometer is designed such that variations in the ratios of these optical branches (branching ratios) fall within respective desired ranges.

The inventor's observations reveal that a multimode interference device including an MMI semiconductor mesa, for example, a semiconductor mesa for 2×2 MMI, which is embedded with a resin body, has an unexpected difference between the bar output and the cross output, i.e., a deviation, but that a multimode interference device including a 1×2 MMI semiconductor mesa embedded with a resin body does not have such a deviation. This indicates that MMI devices of the former type have a cause of performance degradation beyond the design tolerance.

It is an object according to one aspect of the present invention to provide, with a small deviation in branching ratio, a multimode interference device that has an MMI semiconductor mesa embedded with an embedding region. It is an object according to another aspect of the present invention to provide a Mach-Zehnder modulation device including the multimode interference device.

A multimode interference device according to one aspect of the present invention includes: an MMI semiconductor mesa for a multimode interferometer, the MMI semiconductor mesa having a first end face, a second end face, a first side face, and a second side face, the first end face and the second end face being arranged in a direction of a first axis, and the first side face and the second side face extending in the direction of the first axis; a first semiconductor mesa disposed apart from the first side face of the MMI semiconductor mesa; a second semiconductor mesa disposed apart from the second side face of the MMI semiconductor mesa; an embedding region covering the MMI semiconductor mesa, the first semiconductor mesa and the second semiconductor mesa, the embedding region having a first opening and a second opening, and the first opening and the second opening being disposed on the first semiconductor mesa and the second semiconductor mesa, respectively; a first metal body making contact with the first semiconductor mesa through the first opening; and a second metal body making contact with the second semiconductor mesa through the second opening. The first end face has multiple first ports, and the second end face has multiple second ports. The first semiconductor mesa, the MMI semiconductor mesa, and the second semiconductor mesa are arranged in a direction of a second axis intersecting the first axis.

A Mach-Zehnder modulation device according to another aspect of the present invention includes: (a) multiple Mach-Zehnder modulator devices; and (b) a multimode interference device optically coupled to the multiple Mach-Zehnder modulator. The multimode interference device includes: an MMI semiconductor mesa for a multimode interferometer, the MMI semiconductor mesa having a first end face, a second end face, a first side face, and a second side face, the first end face and the second end face being arranged in a direction of a first axis, and the first side face and the second side face extending in the direction of the first axis; a first semiconductor mesa disposed apart from the first side face of the MMI semiconductor mesa; a second semiconductor mesa disposed apart from the second side face of the MMI semiconductor mesa; an embedding region covering the MMI semiconductor mesa, the first semiconductor mesa and the second semiconductor mesa, the embedding region having a first opening and a second opening, and the first opening and the second opening being disposed on the first semiconductor mesa and the second semiconductor mesa, respectively; a first metal body making contact with the first semiconductor mesa through the first opening; and a second metal body making contact with the second semiconductor mesa through the second opening. The first end face has multiple first ports, and the second end face has multiple second ports. The first semiconductor mesa, the MMI semiconductor mesa, and the second semiconductor mesa are arranged in a direction of a second axis intersecting the first axis.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 2A is a schematic cross-sectional view, taken along line I-I shown in FIG. 1, illustrating a multimode interference device in one example according to the embodiment.

FIG. 2B is a schematic top view showing the multimode interference device in the example according to the embodiment.

FIG. 3A is a schematic cross-sectional view, taken along line I-I shown in FIG. 1, illustrating a multimode interference device in another example according to the embodiment.

FIG. 3B is a schematic top view, showing a multimode interference device in the other example according to the embodiment.

FIG. 5A is a schematic cross-sectional view showing a major step in each of a method for fabricating a Mach-Zehnder modulator and a method for fabricating a multimode interference device according to the embodiment.

FIG. 5B is a schematic cross-sectional view showing a major step in the methods according to the embodiment.

FIG. 6A is a schematic cross-sectional view showing a major step in the methods according to the embodiment.

FIG. 6B is a schematic cross-sectional view showing a major step in the methods according to the embodiment.

FIG. 8A is a schematic cross-sectional view showing a major step in the methods according to the embodiment.

FIG. 8B is a schematic cross-sectional view showing a major step in the methods according to the embodiment.

FIG. 9A is a schematic cross-sectional view showing a major step in the methods according to the embodiment.

FIG. 9B is a schematic cross-sectional view showing a major step in the methods according to the embodiment.

FIG. 10A is a schematic cross-sectional view showing a major step in the methods according to the embodiment.

FIG. 10B is a schematic cross-sectional view showing a major step in the methods according to the embodiment.

FIG. 11A is a schematic cross-sectional view showing a major step in the methods according to the embodiment.

FIG. 11B is a schematic cross-sectional view showing a major step in the methods according to the embodiment.

DESCRIPTION OF THE EMBODIMENTS

Figure 1:
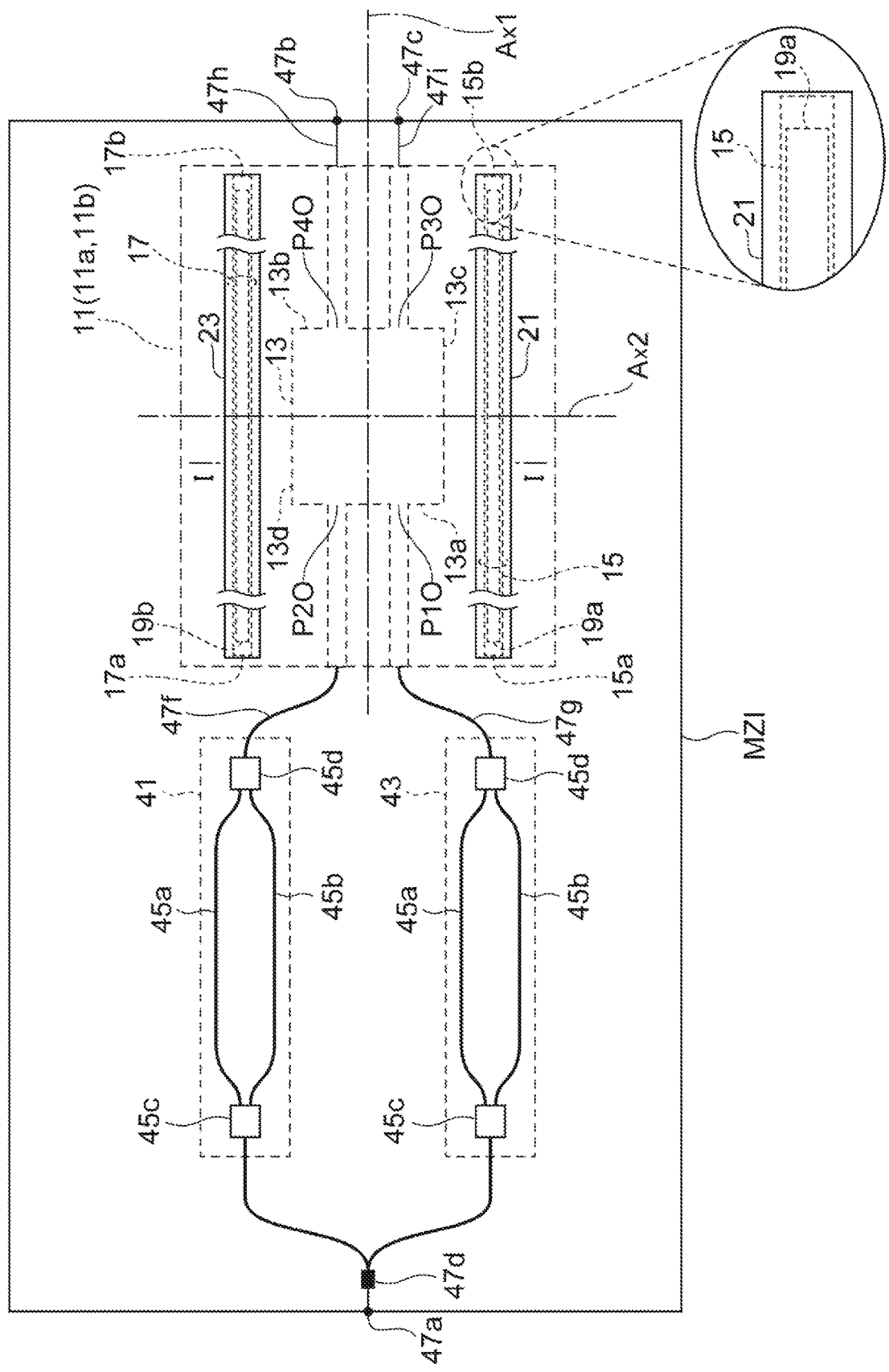
FIG. 1 is a schematic plan view showing a multimode interference device and a Mach-Zehnder modulation device according to the embodiment.

A description will be given of examples according to the embodiment.

A multimode interference device according to an example includes: (a) an MMI semiconductor mesa for a multimode interferometer, the MMI semiconductor mesa having a first end face, a second end face, a first side face, and a second side face, the first end face and the second end face being arranged in a direction of a first axis, and the first side face and the second side face extending in the direction of the first axis; (b) a first semiconductor mesa disposed apart from the first side face of the MMI semiconductor mesa; (c) a second semiconductor mesa disposed apart from the second side face of the MMI semiconductor mesa; (d) an embedding region covering the MMI semiconductor mesa, the first semiconductor mesa and the second semiconductor mesa, the embedding region having a first opening and a second opening, and the first opening and the second opening being disposed on the first semiconductor mesa and the second semiconductor mesa, respectively; (e) a first metal body making contact with the first semiconductor mesa through the first opening; and (f) a second metal body making contact with the second semiconductor mesa through the second opening. The first end face has multiple first ports, and the second end face has multiple second ports. The first semiconductor mesa, the MMI semiconductor mesa, and the second semiconductor mesa are arranged in a direction of a second axis intersecting the first axis.

The multimode interference device is provided with the first and second semiconductor mesas and the MMI semiconductor mesa that are embedded with the embedding region. The first and second semiconductor mesas are spaced apart from the first and second side faces of the MMI semiconductor mesa, respectively, and the first and second metal bodies are disposed on the tops of the first and second semiconductor mesas to form first and second stack structures, respectively. The first stack structure, having the first semiconductor mesa and the first metal body that are stacked, prevents the embedding region, which embeds one side, e.g., the first side face, of the MMI semiconductor mesa from extending outward in the direction of the second axis beyond the first stack structure, and the second stack structure, having the second semiconductor mesa and the second metal body that are stacked, prevents the embedding region, which embeds the other side, e.g., the second side face, of the MMI semiconductor mesa from extending outward in the direction of the second axis beyond the second stack structure. The first and second stack structures restrict respective lengths, taken in the opposite directions on the second axis, of the portions of the embedding region which embed the first and second sides of the MMI semiconductor mesa.

In the multimode interference device according to an example, the MMI semiconductor mesa has a 2×2 structure.

The multimode interference device may be provided with a small number of inputs and a small number of outputs, which make an MMI semiconductor mesa of the multimode interference device short in length in the direction of the second axis. The small MMI semiconductor mesa makes the performance of the multimode interference device sensitive to the lengths, which are taken along axes normal to the respective side faces of the MMI semiconductor mesa, of the portions of the embedding region which embed the first and second side faces thereof.

In the multimode interference device according to an example, the MMI semiconductor mesa has a laminate structure including an upper semiconductor region, a core layer, and a lower semiconductor region, and the first semiconductor mesa and the second semiconductor mesa each are provided with the same as that of the laminate structure of the MMI semiconductor mesa.

The multimode interference device can provide the MMI semiconductor mesa and the first and second semiconductor mesas with no substantial difference in height among these three mesas.

In the multimode interference device according to an example, the first semiconductor mesa has a side face, and a distance between the side face of the first semiconductor mesa and the first side face of the MMI semiconductor mesa is two micrometers or more. The second semiconductor mesa has a side face, and a distance between the side face of the second semiconductor mesa and the second side face of the MMI semiconductor mesa is two micrometers or more.

The multimode interference device is provided with the side face of the first semiconductor mesa, the first side face, the second side face, and the side face of the second semiconductor mesa, which are arranged in order in the direction of the second axis. The embedding region has respective portions which fill a gap between the first side face and the side face of the first semiconductor mesa and a gap between the second side face and the side face of the second semiconductor mesa, the distances of which are not less than 2 micrometers. The distances of not less than 2 micrometers can prevent variations in shape of the first and second openings of the embedding region, which are located on the first and second semiconductor mesas, respectively, and in shape of the first and second metal bodies, which are disposed on the first and second semiconductor mesas, respectively, from having large effects on the characteristics of the multimode interference device.

In the multimode interference device according to an example, the first semiconductor mesa has a side face, and the side face of the first semiconductor mesa is within 20 micrometers from the first side face of the MMI semiconductor mesa. The second semiconductor mesa also has a side face, and the side face of the second semiconductor mesa is within 20 micrometers from the second side face of the MMI semiconductor mesa.

The multimode interference device is provided with the side face of the first semiconductor mesa, the first side face, the second side face, and the side face of the second semiconductor mesa, which are arranged in order in the direction of the second axis. The embedding region has respective portions that fill a gap between the first side face and the side face of the first semiconductor mesa and a gap between the second side face and the side face of the second semiconductor mesa, the distances of which are not less than 2 micrometers. The distances of not more than 2 micrometers may reduce advantageous effects, which are produced by a first structure including the first semiconductor mesa and the first metal body that are stacked and a second structure including the second semiconductor mesa and the second metal body that are stacked, in the performance of the multimode interference device.

In the multimode interference device according to an example, the embedding region includes a first resin body, an inorganic insulating interlayer film, and a second resin body, and the inorganic insulating interlayer film is between the first resin body and the second resin body.

The multimode interference device may be provided with the first and second resin bodies and the interlayer film of inorganic insulating material disposed therebetween. The first resin body is located between the first side face and the side face of the first semiconductor mesa, and the second resin body is located between the second side face and the side face of the second semiconductor mesa. The interlayer film may be disposed on the first resin body, and the second resin body may be disposed on the interlayer film.

In the multimode interference device according to an example, the embedding region includes a first inorganic insulating film and a resin body. The first inorganic insulating film is in contact with a top face, the first side face and the second side face of the MMI semiconductor mesa, a top face and a side face of the first semiconductor mesa, and a top face and a side face of the second semiconductor mesa. The resin body covers the top face, the first and the second side face of the MMI semiconductor mesa, the top face and the side face of the first semiconductor mesa, and the top face and the side face of the second semiconductor mesa.

The multimode interference device allows an integrated resin body to cover the top face and first and second side faces of the MMI semiconductor mesa, the top and side faces of the first semiconductor mesa, and the top and side faces of the second semiconductor mesa.

A Mach-Zehnder modulation device according to an example includes: (a) multiple Mach-Zehnder modulators; and (b) a multimode interference device optically coupled to the multiple Mach-Zehnder modulators. The multimode interference device includes: an MMI semiconductor mesa for a multimode interferometer, the MMI semiconductor mesa having a first end face, a second end face, a first side face, and a second side face, the first end face and the second end face being arranged in a direction of a first axis, and the first side face and the second side face extending in the direction of the first axis; a first semiconductor mesa disposed apart from the first side face of the MMI semiconductor mesa; a second semiconductor mesa disposed apart from the second side face of the MMI semiconductor mesa; an embedding region covering the MMI semiconductor mesa, the first semiconductor mesa and the second semiconductor mesa, the embedding region having a first opening and a second opening, and the first opening and the second opening being disposed on the first semiconductor mesa and the second semiconductor mesa, respectively; a first metal body making contact with the first semiconductor mesa through the first opening; and a second metal body making contact with the second semiconductor mesa through the second opening. The first end face has multiple first ports, and the second end face has multiple second ports. The first semiconductor mesa, the MMI semiconductor mesa, and the second semiconductor mesa are arranged in a direction of a second axis intersecting the first axis.

The Mach-Zehnder modulation device exhibits reduced deviations in merge and division of light from the semiconductor Mach-Zehnder modulators, which are integrated with the multimode interference device on a supporting base.

Teachings of the present invention can be readily understood by considering the following detailed description with reference to the accompanying drawings shown as examples. Referring to the accompanying drawings, a multimode interference device and a Mach-Zehnder modulator, and methods for fabricating a multimode interference device and a Mach-Zehnder modulator according to examples of the present embodiment will be described below. To facilitate understanding, identical reference numerals are used, where possible, to designate identical elements that are common to the figures.

FIG. 1 is a schematic plan view showing a multimode interference device and an integrated Mach-Zehnder modulator according to the embodiment. FIG. 2A is a schematic cross-sectional view, taken along line I-I in FIG. 1, illustrating a multimode interference device according to one example in the embodiment. FIG. 2B is a schematic top view showing the multimode interference device shown in FIG. 2A. FIG. 3A is a schematic cross-sectional view, taken along line I-I in FIG. 1, illustrating a multimode interference device according to another example of the embodiment. FIG. 3B is a schematic top view showing the multimode interference device shown in FIG. 3A.

Referring to FIG. 1, the multimode interference device 11 includes an MMI semiconductor mesa 13, a first semiconductor mesa 15, a second semiconductor mesa 17, an embedding region 19, a first metal body 21, and a second metal body 23. The MMI semiconductor mesa 13 can be provided so as to constitute a multimode interference device having n-inputs and m-outputs (referred to as, for example, "n×m MMI"), where "n" and "m" each are an integer, and has a first end face 13a, a second end face 13b, a first side face 13c, a second side face 13d, and a top face 13e. The first and second end faces 13a and 13b and the top face 13e are arranged in the direction of the first axis Ax1, and the first and second side faces 13c and 13d and the top face 13e extend in the direction of the first axis Ax1. In the present example shown in the figures, the MMI semiconductor mesa 13 has a substantially rectangular parallelepiped shape. The first end face 13a has multiple first optical ports (in the example, two optical ports P1O and P2O), and the second end face 13b has multiple second optical ports (in the example, two optical ports P3O and P4O). In the present example, an exemplary multimode interference device with two inputs and two outputs is referred to as "2×2 MMI".

The first and second semiconductor mesas 15 and 17 are disposed spaced apart from the first and second side faces 13c and 13d of the MMI semiconductor mesa 13. The first semiconductor mesa 15, the MMI semiconductor mesa 13, and the second semiconductor mesa 17 are arranged in the direction of a second axis Ax2 that intersects the first axis Ax1. The MMI semiconductor mesa 13 is not optically coupled to the first and second semiconductor mesas 15 and 17, which are optically isolated from optical elements in the integrated Mach-Zehnder modulator. In this example, each of the first and second semiconductor mesas 15 and 17 has substantially the same structure (25) as the laminate structure of the MMI semiconductor mesa 13.

The first and second semiconductor mesas 15 and 17 extend in the direction of the first axis Ax1, and each have, for example, a shape of a strip mesa. The first semiconductor mesa 15 has one end 15a and another end 15b, and the second semiconductor mesa 17 has one end 17a and another end 17b. The first semiconductor mesa 15 is separated from the second semiconductor mesa 17, and the MMI semiconductor mesa 13 is disposed between the first and second semiconductor mesas 15 and 17. The one end 15a and the other end 15b of the first semiconductor mesa 15 are separated apart from the boundary of the integrated Mach-Zehnder modulator that includes the multimode interference device 11 and from a semiconductor mesa for another optical element that is integrated with the multimode interference device. This separation can prevent the first semiconductor mesa 15 from being optically coupled to an external device outside the multimode interference device 11 and the integrated Mach-Zehnder modulator. In addition, the one end 17a and the other end 17b of the second semiconductor mesa 17 are separated apart from the boundary of the integrated Mach-Zehnder modulator that includes the multimode interference device 11 and from a semiconductor mesa for another optical element that is integrated with the multimode interference device 11. This separation can prevent the second semiconductor mesa 17 from being optically coupled to an external device outside the multimode interference device 11 and the integrated Mach-Zehnder modulator. Further, the embedding region 19 embeds the ends 15a and 15b of the first semiconductor mesa 15 and the ends 17a and 17b of the second semiconductor mesa 17 to terminate the first and second semiconductor mesas 15 and 17.

The first and second metal bodies 21 and 23 extend in the direction of the first axis Ax1, and the embedding region 19 has a first opening 19a and a second opening 19b, which are located on the first and second semiconductor mesas 15 and 17, respectively. Each of the first and second openings 19a and 19b extends in the direction of the first axis Ax1. The first metal body 21 makes contact with the top face of the first semiconductor mesa 15 through the first opening 19a of the embedding region 19. The second metal body 23 makes contact with the top face of the second semiconductor mesa 17 through the second opening 19b of the embedding region 19. The embedding region 19 covers the MMI semiconductor mesa 13, in particular, the first end face 13a, the second end face 13b, the first side face 13c, the second side face 13d and the top face 13e, and the first and second semiconductor mesas 15 and 17, in particular, ends 15a, 15b, 17a and 17b.

FIG. 1 contains broken lines to indicate the shapes of the first and second semiconductor mesas 15 and 17 which are embedded with the embedding region. More specifically, as shown in FIGS. 1, 2A, 2B, 3A and 3B, the embedding region 19 buries one groove defined by the first side face 13c of the MMI semiconductor mesa 13 and the first semiconductor mesa 15, and another groove defined by the second side face 13d of the MMI semiconductor mesa 13 and the second semiconductor mesa 17, in addition to the protrusions (the MMI semiconductor mesa 13, the first semiconductor mesa 15 and the second semiconductor mesa 17) that protrude from the principal face of the substrate.

The multimode interference device 11 is provided with the embedding region 19 that embeds the MMI semiconductor mesa 13 and the first and second semiconductor mesas 15 and 17. The first and second semiconductor mesas 15 and 17 are spaced apart from the first and second side faces 13c and 13d of the MMI semiconductor mesa 13, respectively. The first and second metal bodies 21 and 23 are spaced apart from each other, and are disposed on the first and second semiconductor mesas 15 and 17, respectively. The first semiconductor mesa 15 and the first metal body 21 are stacked on the principal surface to form a first stack structure, and the first stack structure prevents the embedding region 19, which buries the MMI semiconductor mesa 13 on the first side face 13c, from extending beyond the first stack structure in the direction of the second axis Ax2. The second semiconductor mesa 17 and the second metal body 23 are stacked on the principal surface to form a second stack structure, and the second stack structure prevents the embedding region 19, which buries the MMI semiconductor mesa 13 on the second side face 13d, from extending beyond the second stack structure in the direction of the axis Ax2. The first and second stack structures limit the lengths of the respective portions of the embedding region 19 which are disposed on the first and second side faces 13c and 13d of the MMI semiconductor mesa 13 and extend outward in the opposite directions on the second axis Ax2.

The embedding region 19 extends from the first side face 13c in a direction of an axis normal thereto at any point thereon to reach the inner side face of the first semiconductor mesa 15, and this axis also reaches the inner side face thereof and is bent to extend along the inner side thereof to one of the ends (the end 15a or 15b) of the first semiconductor mesa 15. At this end, the axis goes around the outer side face, opposite to the inner side face, of the first semiconductor mesa 15. The embedding region 19 is terminated by the first stack structure and extends along the inner side of the first stack structure to both ends 15a and 15b. At these ends, the embedding region 19 extends via the ends of the first stack structure to the backside of the first semiconductor mesa 15 to go around the first stack structure, which can prevent the embedding region 19 from climbing over the first semiconductor mesa 15. Similarly, the embedding region 19 extends from the second side face 13d of the MMI semiconductor mesa 13 in a direction of an axis normal thereto, and this axis extends through one of the ends of the second semiconductor mesa 17 to the backside of the second semiconductor mesa 17 to go around the second stack structure. The circumvention of the axes indicates that the embedding region 19 on both sides thereof circumvents the first and second semiconductor mesas 15 and 17. Specifically, the first and second stack structures partition the embedding region 19 to define first and second portions which are between the first side face 13c of the MMI semiconductor mesa 13 and the inner face of the first semiconductor mesa 15 and between the second side face 13d of the MMI semiconductor mesa 13 and the inner face of the second semiconductor mesa 17, respectively. The arrangement of the first and second semiconductor mesas 15 and 17 limits the first and second portions of the embedding region in size. The first and second portions of small volumes make it possible to reduce stress which the MMI semiconductor mesa 13 receives from the embedding region 19.

In an example, the MMI semiconductor mesa 13 of the multimode interference device 11 (11a and 11b) can have a 2-input and 2-output MMI structure. Regarding the multimode interference device 11, a multimode interference device with small numbers of inputs and outputs may provide the MMI semiconductor mesa 13 with a small length in the direction of the second axis Ax2, and the multimode interference device of the small length makes the MMI semiconductor mesa sensitive to stress applied by the embedding resin portions embedding the first and second sides 13c and 13d.

As shown in FIGS. 2A, 2B, 3A and 3B, the MMI semiconductor mesa 13 has a semiconductor laminate structure 25, which has an upper semiconductor region 25a, a core region 25b and a lower semiconductor region 25c. The upper semiconductor region 25a, the core region 25b, and the lower semiconductor region 25c are disposed on the principal surface 1a of the substrate 1, and arranged in order in the direction that is normal to the principal surface 1a of the substrate 1. Each of the first and second semiconductor mesas 15 and 17 is provided with the semiconductor laminate structure 25, which is substantially the same as that of the MMI semiconductor mesa 13. Providing the mesas (13, 15 and 17) with the semiconductor laminate structure 25 in the multimode interference device 11 can keep the level of the first and second semiconductor mesas 15 and 17 with that of the MMI semiconductor mesa 13.

The embedding region 19 may include a lower inorganic insulating layer 27, an upper inorganic insulating layer 29, and an interlayer structure 31. The lower inorganic insulating layer 27 covers the top and side faces of the MMI semiconductor mesa 13 and first and second semiconductor mesas 15 and 17. The upper inorganic insulating layer 29 acts as an underlayer on which the first and second metal bodies 21 and 23 are disposed. The interlayer structure 31 is disposed between the lower and upper inorganic insulating layers 27 and 29. The lower and upper inorganic insulating layers 27 and 29 each may include a silicon-based inorganic insulator, such as silicon nitride or silicon oxynitride, and the interlayer structure 31 may include a resin body 33, such as benzocyclobutene (BCB) resin.

Referring to FIGS. 2A and 2B, the interlayer structure 31 may have a multilayered-resin embedding structure, and specifically, this embedding structure includes an interlayer inorganic insulating film 31a and a resin portion 33 (containing a first resin body 33a and a second resin body 33b). The interlayer inorganic insulating film 31a intervenes between the first and second resin bodies 33a and 33b. The interlayer inorganic insulating film 31a may include a silicon-based inorganic insulator, such as silicon nitride or silicon oxynitride.

The multimode interference device 11 may have the following structure. The first resin body 33a fills between the first side face 13c and the inner side face of the first semiconductor mesa 15 and between the second side face 13d and the inner side face of the second semiconductor mesa 17 to embed the MMI semiconductor mesa 13 and the first and second semiconductor mesas 15 and 17. The interlayer inorganic insulating film 31a is disposed on the first resin body 33a and the top face 13e of the MMI semiconductor mesa 13, and if necessary, on the top and side faces of the first and second semiconductor mesas 15 and 17. The second resin body 33b extends along the inorganic insulating interlayer film 31a, and has openings (parts of 19a and 19b) on the top faces of the first and semiconductor mesas 15 and 17. The lower inorganic insulating layer 27, the interlayer inorganic insulating film 31a, and the upper inorganic insulating layer 29 have respective openings (associated with 19a and 19b) on the top faces of the first and second semiconductor mesas 15 and 17. The first metal body 21 has a first metal layer 21a and a second metal layer 21b. The second metal body 23 has a first metal layer 23a and a second metal layer 23b. The first metal layer 21a is disposed on the top face of the first semiconductor mesa 15 and extends from one end of the first semiconductor mesa 15 to the other end along the first semiconductor mesa 15, and the first metal layer 23a is also disposed on the top face of the second semiconductor mesa 17 and extends from one end of the second semiconductor mesa 17 to the other end along the second semiconductor mesa 17. The second metal layers 21b and 23b and the second resin body 33b are disposed on the interlayer inorganic insulating film 31a.

In the embedding region 19 that includes the two resin bodies, the first and second semiconductor mesas 15 and 17 define respective lengths of the fillings, the dimensions of which are referred to as a lateral length (TW), of the first resin body 33a which makes contact with the sides of the MMI semiconductor mesa 13, and restrict the volumes of the fillings of the second resin body 33b from the top face of the MMI semiconductor mesa 13 in the opposite directions along with the first and second metal bodies 21 and 23, which lie on the first and second semiconductor mesas 15 and 17, respectively. In the present example, the multimode interference device 11 may be provided with a passivation film 35, which covers the metal bodies (21 and 23), in addition to the embedding region 19. In particular, the passivation film 35 covers all the top and side faces of the metal body (21 and 23) except for the bottom face.

Referring to FIGS. 3A and 3B, the interlayer structure 31 may have a single-layer resin embedding structure, and has an embedding structure which includes a single resin body 33c, and the single resin body 33c is disposed on the lower inorganic insulating layer 27, which covers the top, side and end faces of the MMI semiconductor mesa 13, and the first and second semiconductor mesas 15 and 17. The upper inorganic insulating layer 29 is disposed on the single resin body 33c (33). The upper inorganic insulating layer 29 covers the upper faces of the single resin body 33c and the first and second semiconductor mesas 15 and 17. The lower and upper inorganic insulating layers 27 and 29 have respective openings on the first and second semiconductor mesas 15 and 17, and the single resin body 33c has respective openings on the first and second semiconductor mesas 15 and 17. The first and second metal bodies 21 and 23 are connected to the first and second semiconductor mesas 15 and 17 through the openings (19a and 19b) of the lower and upper inorganic insulating layers 27 and 29 and the single resin body 33c, and specifically make contact with the top faces of the first and second semiconductor mesas 15 and 17.

In the embedding region 19 that includes the single-layered resin 33c, the first stack structure, which includes the first semiconductor mesa 15 and the first metal body 21, prevents the single resin body from extending long from the top face 13e of the MMI semiconductor mesa 13, and restricts the size of the filling of the single resin body, the dimension of which is referred to as a lateral length (TW), on the first side face 13c, and the second stack structure, which includes the second semiconductor mesa 17 and the second metal body 23, prevents the single resin body from extending long from the top face 13e of the MMI semiconductor mesa 13, and restricts the size of the filling of the single resin body, the dimension of which is referred to as a lateral length (TW) on the second side face 13d. In the present example, the multimode interference device 11 can be provided with the metal bodies (21 and 23) and the passivation film 35, which covers the embedding region 19. The passivation film 35 covers all the top and side faces of the metal bodies (21 and 23) except for the bottom face thereof.

Referring back to FIG. 1, the Mach-Zehnder modulator device MZI is provided with multiple semiconductor Mach-Zehnder modulators 41 and 43 and the multimode interference device 11, which is optically coupled to the outputs of the semiconductor Mach-Zehnder modulators 41 and 43. The semiconductor Mach-Zehnder modulators 41 and 43 each include a first arm mesa 45a, a second arm mesa 45b, a first optical coupler 45c, and a second optical coupler 45d. The first and second arm mesas 45a and 45b are made of semiconductor. The first optical coupler 45c is connected to one ends of the first and second arm mesas 45a and 45b, and the second optical coupler 45d is connected to the other ends of the first and second arm mesas 45a and 45b.

In this example, the Mach-Zehnder modulator device MZI may include a semiconductor optical integrated circuit, and has an input port 47a, a first output port 47b, and a second output port 47c thereon. In the integrated optical circuit, the input port 47a is optically coupled to the semiconductor Mach-Zehnder modulators 41 and 43 through a branching device 47d, such as a 1×2 multimode interference device (MMI). As described above, the multimode interference device 11, acting as an optical merger and an optical divider, may be coupled to the outputs of the semiconductor Mach-Zehnder modulators 41 and 43, and is coupled to the first and second output ports 47b and 47c. The multimode interference device 11 is provided with the optical ports P1O and P2O, which receive light beams from the semiconductor Mach-Zehnder modulators 41 and 43 via the first and second waveguide mesas 47f and 47g, respectively. The multimode interference device 11 is provided with the optical ports P3O and P4O, which are optically coupled to the first and second output ports 47b and 47c via the third and fourth waveguide mesas 47h and 47i.

The multimode interference device 11 allows the Mach-Zehnder modulator device MZI to have a technical contribution, e.g., exhibit reduced deviations in merging light beams from the semiconductor Mach-Zehnder modulators 41 and 43. As seen from the above description, the multimode interference device 11 brings the Mach-Zehnder modulator device MZI the above technical contribution. The advantageous effect is brought to such a multimode interferometer, but is not, however, limited thereto. The same and similar technical contributions are also brought to an optical device that includes a multimode interference device with pluralities of input ports and output ports.

Figure 4A:
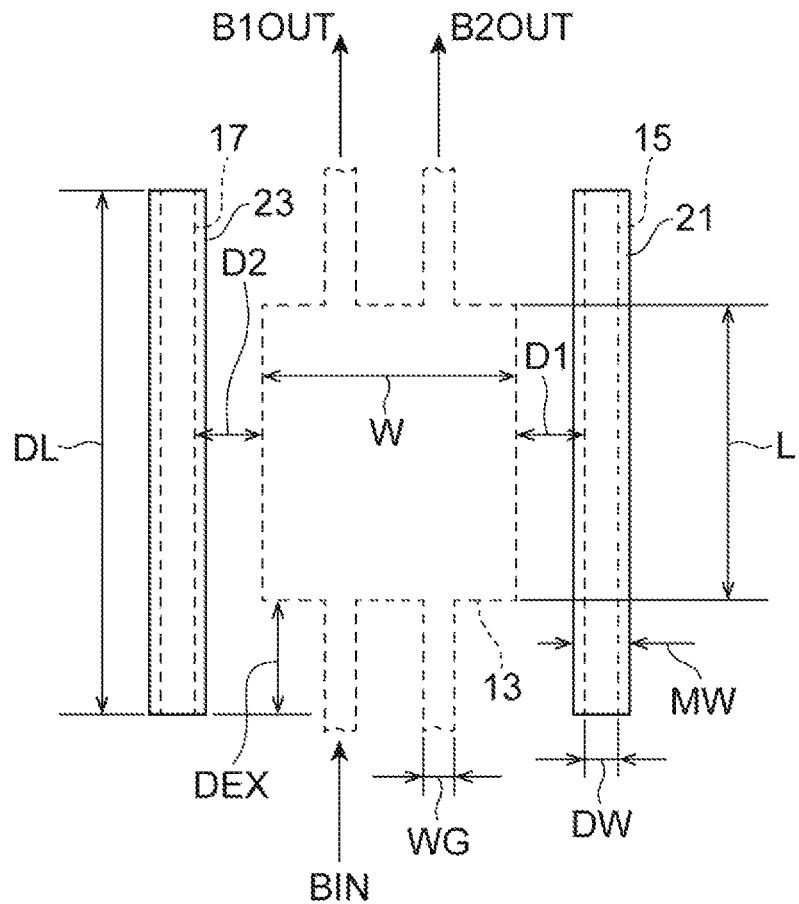
FIG. 4A is a schematic top view showing a simulation model of a multimode interference device according to the embodiment.
Figure 4B:
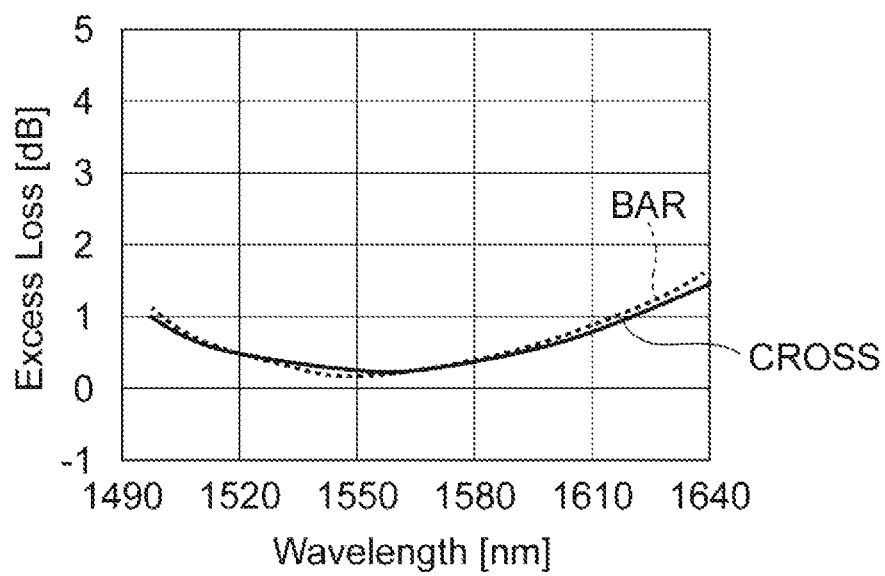
FIG. 4B is a graph showing simulation results in the model shown in FIG. 4A.

FIG. 4A is a view showing a model for use in simulation of a multimode interference device in an example according to the embodiment. FIG. 4B is a view showing a simulation result of the multimode interference device according to the model. Referring to FIG. 4A, the multimode interference device has a structure of 2×2 MMI in the example.

An exemplary multimode interference device has the following dimensions:
Width, referred to as WG, of waveguide mesa to input and output ports of the MMI: 2 micrometers
Width, referred to as W, of MMI semiconductor mesa 13: 20 micrometers
Length, referred to as L, of MMI semiconductor mesa 13: 550 micrometers
Thickness of MMI semiconductor mesa 13 (25): 2 micrometers
Thickness of the first semiconductor mesa 15 (25) and the second semiconductor mesa 17 (25): 2 micrometers
Distances, referred to as D1 and D2, between the first and second semiconductor mesas 15 and 17 and the MMI semiconductor mesa 13: 5 micrometers
Mesa width, referred to as DW, of the first and second semiconductor mesas 15 and 17: 2 micrometers
Mesa length, referred to as DL, of the first and second semiconductor mesas 15 and 17: 650 micrometers
Thickness of first and second metal bodies 21 and 23: 5 micrometers
Width, referred to as MW, of the first and second metal bodies 21 and 23: 3 micrometers
Outer length of the interfaces between the first semiconductor mesa 15 and the first metal body 21 and between the second semiconductor mesa 17 and the second metal body 23 with respect to the end faces (13a and 13b) of the MMI semiconductor mesa 13 (referred to as DEX): 50 micrometers
Refractive index of BCB of the embedding region 19: 1.6
Refractive index of the inorganic films (27, 29 and 31a) in the embedding region 19: 1.5
Refractive indices of the first and second semiconductor mesas 15 and 17 and the MMI semiconductor mesa 13: 3.5
In the embedding region 19
Thickness of the lower BCB layer, 2 micrometers
Thickness on the upper BCB layer, 2 micrometers Referring to FIG. 4B, the multimode interference device in an example according to the embodiment exhibits simulated characteristics in a branch ratio. Characteristics curve BAR indicates branching characteristics (B1N to B1OUT) from an input port to the output port that is positioned directly opposite to the input port, and the characteristics curve CROSS indicates branching characteristics (B1N to B2OUT) from an input port to the output port that is diagonally opposite to the input port. The first and second semiconductor mesas 15 and 17 are apart from the left and right sides of the 2×2 MMI by a same distance, and the MMI semiconductor mesa 13, the first semiconductor mesa 15 and the second semiconductor mesa 17 are embedded with BCB resin.

The first and second metal bodies 21 and 23, which are on the first and second semiconductor mesas 15 and 17, respectively, are formed by vapor deposition and plating. The addition of the first and second semiconductor mesas 15 and 17 and the first and second metal bodies 21 and 23 to a multimode interference device can prevent BCB resin that embeds the MMI semiconductor mesa 13 from continuing. Arranging the first and second metal bodies 21 and 23 and the first and second semiconductor mesas 15 and 17 on the respective sides of the MMI semiconductor mesa 13 makes deviations between the BAR and CROSS ports reduced, and allows the adjustment of distances between the MMI semiconductor mesa 13 and the first and second semiconductor mesas 15 and 17. A bare multimode interference device which includes none of the first and second semiconductor mesas 15 and 17 and the first and second metal bodies 21 and 23 has deviations of, for example, about 1 dB in branching ratios.

The above experiment and other experiments reveal that the first side face 13c is preferably separated 20 micrometers or less from the inner side face of the first semiconductor mesa 15 and that the second side face 13d is preferably separated 20 micrometers or less from the inner side face of the second semiconductor mesa 17. The intervals exceeding 20 micrometers in the embedding region 19 is likely to reduce the technical contribution, which comes from the first stack structure that includes the first semiconductor mesa 15 and the first metal body 21 and the second stack structure that includes the metal body 23 and the second semiconductor mesa 17, to the characteristics of the multimode interference device 11.

The interval between the first side face 13c and the inner side face of the first semiconductor mesa 15 can be 2 micrometers or more, and the interval between the second side face 13d and the inner side face of the second semiconductor mesa 17 can be 2 micrometers or more. The difference between these intervals is preferably less than or equal to 0.5 micrometers.

The first metal body 21 makes contact with the first semiconductor mesa 15 to form an interface therebetween, and the second metal body 23 makes contact with the second semiconductor mesa 17 to form an interface therebetween. These interfaces extend in the direction of the first axis Ax1, and have respective extensions, each of which is defined as a length taken in the direction of the first axis Ax1 with respect to the position of each end face of the MMI semiconductor mesa 13, in association with those of the first and second semiconductor mesas 15 and 17 and the first and second metal bodies 21 and 23, and each of the extensions of the interfaces is referred to as a length (DEX), which is at least 10 micrometers.

The multimode interference device 11 may provide the embedding region 19 with the intervals of not less than 2 micrometers between the MMI semiconductor mesa 13 and the first and second semiconductor mesas 15 and 17. The intervals of less than 2 micrometers in the embedding region 19 are likely to make the performance of the multimode interference device sensitive to variations in shape of the first and second openings 19a and 19b and in shape of the first and second metal bodies 21 and 23.

A description will be given of a method of fabricating a multimode interference device according to the present embodiment below with reference to FIGS. 5A to 8B. FIGS. 5A to 8B are cross-sectional views each show a major step in the method of fabricating a multimode interference device and the method of fabricating a Mach-Zehnder modulator. To facilitate understanding, the reference numerals in the description made with reference to FIGS. 1 and 2A to 4B will be used below, where possible.

The method for fabricating the multimode interference device 11 includes a step for preparing a substrate for crystal growth, for example, a semiconductor wafer WF. As shown in FIG. 5A, the semiconductor wafer WF is placed in a growth reactor, and the growth reactor receives source gas to epitaxially grow the semiconductor crystal of the semiconductor stack 51 for the optical waveguide on the semiconductor wafer WF. This growth produces an epitaxial substrate EP by crystal growth, such as metal organic vapor phase epitaxy or molecular beam epitaxy.

Exemplary Epitaxial Substrate EP
Semiconductor wafer WF: semi-insulating InP substrate
Semiconductor laminate 51: an $n^+$-type InP contact layer 51a, an n-type InP cladding layer 51b, a core layer 51c having a multilayer quantum well structure (the multilayer quantum well structure includes an undoped AlGaInAs well layer and an undoped AlGaInAs barrier layer), a p-type InP cladding layer 51d, and a $p^+$-type InGaAs contact layer 51e
Thickness of the semiconductor laminate 51: 2.5 micrometers As shown in FIG. 5A, a first mask M1 to define waveguide mesas is formed on the epitaxial substrate EP by photolithography and etching. The first mask M1 has patterns which define, for example, arm waveguides and optical couplers of multiple Mach-Zehnder modulators, waveguide mesas connected to the Mach Zehnder modulators, and mesas associated with the multimode interference device 11. Specifically, the first mask M1 in an example according to the embodiment includes a first pattern M1WG1 which defines a first semiconductor mesa 15, a second pattern M1WG2 which defines a semiconductor mesa 17, and a third pattern M1MMI which defines an MMI semiconductor mesa 13. After forming the first mask M1 on the epitaxial substrate EP, the epitaxial substrate EP is placed in a processing apparatus 10a for etching. The etching includes a dry etching which uses a fluorine-based etchant.

The first mask M1 is fabricated in an exemplary manner as follows. An SiN film having a thickness of 300 nm is deposited on the epitaxial substrate EP by chemical vapor deposition (CVD), and then resist is coated on the SiN film. Photolithography produces a resist mask from the resist on the SiN film, and the resist mask has strip patterns for not only Mach-Zehnder modulators but also the first and second semiconductor mesas. Etchant of $CF_4$ is supplied to a reactive ion etching (RIE) apparatus to form a SiN mask by dry etching, thereby transferring the patterns of the resist mask to the SiN film. After the etching, the resist mask is removed by ashing with oxygen ($O_2$).

As shown in FIG. 5B, the epitaxial substrate EP is etched with the first mask M1 in the processing apparatus 10a to form a first substrate product SP1. After the etching, the first mask M1 is removed.

Specifically, first to third patterns M1WG1, M1WG2, and M1MMI are shown which define the planar shapes of the MMI semiconductor mesa 13, the first semiconductor mesa 15, and the second semiconductor mesa 17, respectively. The dry etching uses an etchant gas, such as chlorine, as an etchant. The first substrate product SP1 includes an MMI semiconductor mesa 13, a first semiconductor mesa 15, and a second semiconductor mesa 17. In this example, each of the MMI semiconductor mesa 13 and the first and second semiconductor mesas 15, and 17 is provided with the upper semiconductor region 25a, the core region 25b, and the lower semiconductor region 25c, which are shown in FIGS. 2A, 2B, 3A and 3B. The upper semiconductor region 25a includes a p-type InP cladding layer 51d and a $p^+$-type InGaAs contact layer 51e. The core region 25b includes a core layer 51c having a multilayer quantum well structure (which may have a well layer of undoped AlGaInAs and a barrier layer of undoped AlGaInAs). The lower semiconductor region 25c includes an $n^+$-type InP contact layer 51a and an n-type InP cladding layer 51b. In the first substrate product SP1, the MMI semiconductor mesa 13, the first semiconductor mesa 15, and the second semiconductor mesa 17 each have a bottoms in the lower semiconductor region 25c, which is conductive, more specifically, in the $n^+$-type InP contact layer 51a. Accordingly, the etching that forms the MMI semiconductor mesa 13, the first semiconductor mesa 15, and the second semiconductor mesa 17 brings the first substrate product SP1 a semiconductor face 51f. The lower semiconductor region 25c, specifically, the n+-type InP contact layer 51a is provided with the semiconductor face 51f. The semiconductor face 51f extends along a reference plane that intersects an axis normal to the principal surface of the semiconductor wafer WF, and the MMI semiconductor mesa 13, the first semiconductor mesa 15, and the second semiconductor mesa 17 are arranged to protrude with respect to this reference plane. In the present example, the MMI semiconductor mesa 13, the first semiconductor mesa 15, and the second semiconductor mesa 17 are provided with the same laminate structure to allow these mesas to have the same height.

An exemplary etching process is performed as follows. The semiconductor stack 51 is etched by RIE with the SiN mask to form a semiconductor mesa. After the etching, the SiN mask is removed.

After removing the first mask M1, as shown in FIG. 6A, a first dielectric film 53 is grown so as to cover the MMI semiconductor mesa 13, the first and second semiconductor mesas 15 and 17, and the semiconductor face 51f. Specifically, the first dielectric film 53 is grown on the entire surface of the substrate. The first dielectric film 53 may include a silicon-based inorganic insulating film, such as silicon nitride (SiON), and the silicon-based inorganic insulating film can be formed, for example, by chemical vapor deposition.

Resin, such as BCB resin, may be applied to the first dielectric film 53 to embed the side faces of the MMI semiconductor mesa 13, the first and second semiconductor mesas 15 and 17, and the semiconductor face 51f, and the applied resin is cured by heat treatment into a cured resin (referred to as "resin 55a") that embeds the side faces of the MMI semiconductor mesa 13, the first and second semiconductor mesas 15 and 17, and the semiconductor face 51f. Specifically, a resin layer is formed by coating so as to embed the side and top faces of the MMI semiconductor mesa 13 and the first and second semiconductor mesas 15 and 17, and the resin thus applied is processed by etch-back into the resin 55a of a desired thickness, which is thin enough to expose the top faces of the MMI semiconductor mesa 13 and the first and second semiconductor mesas 15 and 17. Alternatively, resin may be coated multiple times to form a resin multilayer film on the semiconductor face 51f, e.g., the resin 55a, and the resin multilayer has a desired thickness that allows the MMI semiconductor mesa 13 and the first and second semiconductor mesas 15 and 17 to embed the side faces of these mesas with and their top faces appearing. A second dielectric film 57 is grown on the resin 55a and the first dielectric film 53. The second dielectric film 57 may include a silicon-based inorganic insulating film, such as silicon oxynitride (SiON), and the silicon-based inorganic insulating film is formed, for example, by chemical vapor deposition. In this example, the second dielectric film 57 is grown on the entire surface of the substrate.

As shown in FIG. 6B, the first and second dielectric films 53 and 57 are processed by photolithography and etching to form a first opening O1P and a second opening O2P therein. The first and second openings O1P and O2P are located on the top faces of the first and second semiconductor mesas 15 and 17, respectively, and expose the top faces of the first and second semiconductor mesas 15 and 17, respectively.

The above processes, i.e., forming the first dielectric film 53, the resin 55a and the second dielectric film 57 and then forming the first and second openings O1P and O2P, bring a lower embedding region 60a to completion.

After forming the first and second openings O1P and O2P in both of the first and second dielectric films 53 and 57, a second mask M2 is formed for a lift-off process on the second dielectric film 57 of the lower embedding region 60a. The second mask M2 has a first opening M2OP1 and a second opening M2OP2 on the top faces of the first and second semiconductor mesas 15 and 17, respectively. The first and second openings M2OP1 and M2OP2 expose the respective top faces of the first and second semiconductor mesas 15 and 17. The second mask M2 may include, for example, resist.

After forming the second mask M2, a metal layer (referred to as 61 and 61OF) is deposited on the entire face of the substrate. The metal layer 61 is formed on the top faces of the first and second semiconductor mesas 15 and 17 in the first and second openings M2OP1 and M2OP2, and the metal layer 61OF is deposited on the second mask M2. Removing the second mask M2 by liftoff patterns the metal layers 61 and 61OF, so that the metal layer 61 remains on the top faces of the first and second semiconductor mesas 15 and 17 and the metal layer 61OF disappears along with the second mask M2.

Figure 7A:
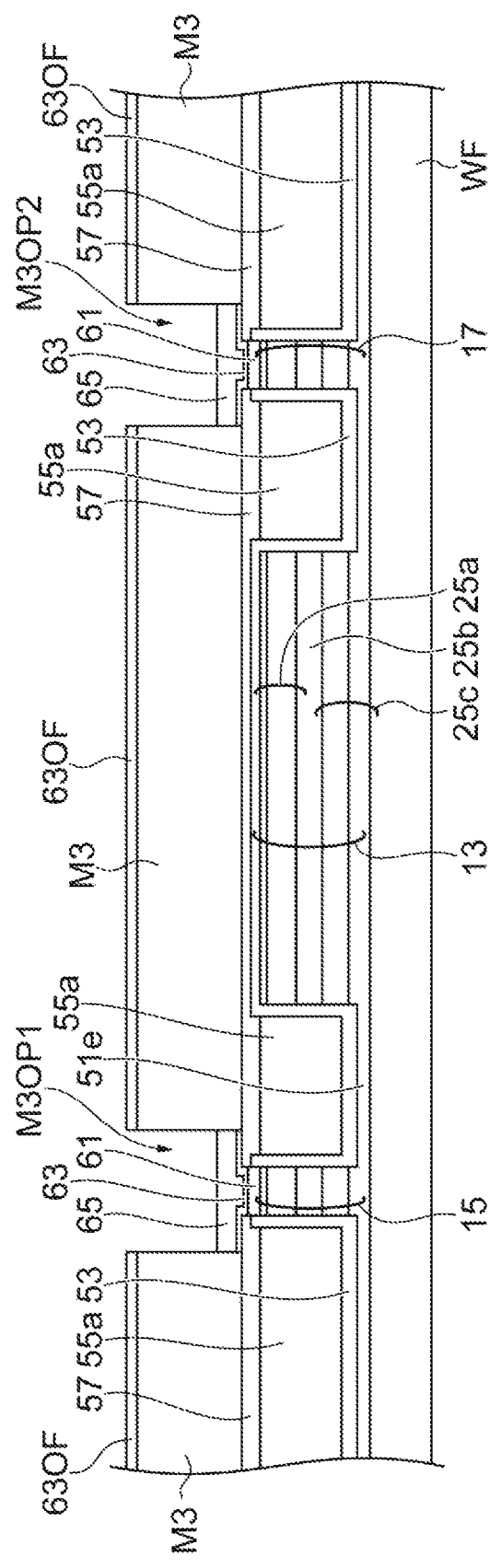
FIG. 7A is a schematic cross-sectional view showing a major step in the methods according to the embodiment.

As shown in FIG. 7A, after forming the metal layer 61, a third mask M3 to define a plating area is formed on the first and second dielectric films 53 and 57. The third mask M3 has a first opening M3OP1 and a second opening M3OP2, which are disposed on the respective parts, located on the first and second semiconductor mesas 15 and 17, of the metal layer 61. The first and second openings M3OP1 and M3OP2 expose the respective metal layers 61. The third mask M3 includes, for example, a thick resist film.

After forming the third mask M3, a first seed metal layer 63 and 63OF, such as Ti/Au, is deposited on the entire surface of the substrate, and after forming the first seed metal layer 63, a first plated metal layer 65 is formed thereon by plating (for example, gold plating) without removing the third mask M3. Metal for the first plated metal layer 65 grows on the first seed metal layer 63 and does not grow on the third mask M3. Removing the third mask M3 after depositing the first plated metal layer 65 leaves the first seed metal layer 63 and the first plated metal layer 65 on both of the second dielectric film 57 and the metal layer 61, which is on each of the first and second semiconductor mesas 15 and 17.

Figure 7B:
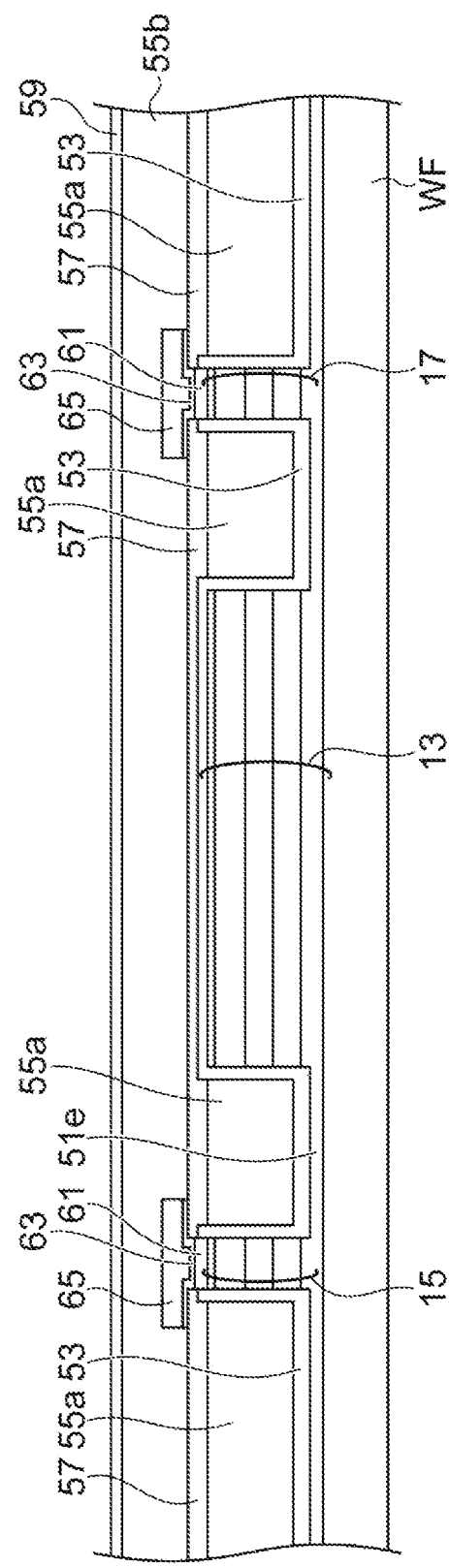
FIG. 7B is a schematic cross-sectional view showing a major step in the methods according to the embodiment.

After forming the metal layers 63 and 65, as shown in FIG. 7B, the application of resin, such as a BCB resin, to the entire surface of the substrate product by coating forms a second dielectric film 57 to embed the metal layers 63 and 65. The applied resin is cured by heat treatment into a cured resin (referred to as a "resin 55b"). The resin 55b, which is formed on the second dielectric film 57 and the top faces and side faces of the metal layers 63 and 65, is provided with a thickness sufficient to bury the metal layers 63 and 65 under the cured resin. After the curing process, a third dielectric film 59 is grown on the resin 55b. The third dielectric film 59 may include a silicon-based inorganic insulating film, such as silicon oxide, and the silicon-based inorganic insulating film is formed, for example, by chemical vapor deposition. In this example, the third dielectric film 59 is grown to cover the entire surface of the resin 55b.

As shown in FIG. 8A, after forming the resin 55b and the third dielectric film 59, a fourth mask M4 is formed thereon. The fourth mask M4 defines an opening to the first plated metal layer 65. Specifically, the fourth mask M4 has a first opening M4OP1 and a second opening M4OP2. The first and second openings M4OP1 and M4OP2 are positioned to the first and second semiconductor mesas 15 and 17, respectively, which mount respective the first plated metal layers 65 on the top faces of the first and second semiconductor mesas. The resin 55b and the third dielectric film 59 are etched with the fourth mask M4 to form a third opening O3P and a fourth opening O4P in the resin 55b and the third dielectric film 59. The third and second openings O3P and O4P reach the respective first plated metal layers 65 which are located on the first and second semiconductor mesas 15 and 17. The third and fourth opening O3P and O4P expose the respective first plated metal layers 65. The fourth mask M4 may include, for example, resist. The fourth mask M4 is removed after the resin 55b and the third dielectric film 59 are etched.

Forming the resin 55b and the third dielectric film 59 and forming the third and fourth openings O3P and O4P therein bring an upper embedding region 60b to completion. In the example, the lower and upper embedding regions 60a and 60b form the embedding region 60.

After the third and fourth openings O3P and O4P are formed in the resin 55b and the third dielectric film 59, as shown in FIG. 8B, a fifth mask M5 to define the planer shape of an upper metal body is formed on the first plated metal layer 65, the resin 55b, and the third dielectric film 59. The fifth mask M5 has a first opening M5OP1 and a second opening M5OP2. The first and second openings M5OP1 and M5OP2 are located on the top faces of the first and second semiconductor mesas 15 and 17, which mount the respective first plated metal layers 65 on the top faces thereof. The first and second openings M5OP1 and M5OP2 expose the respective first plated metal layers 65. The fifth mask M5 includes, for example, a thick film of resist.

After forming the fifth mask M5 on the substrate, a second seed metal layer 67, such as Ti/Au, is deposited on the entire surface of the substrate product. After forming the second seed metal layer 67, the second plated metal layer 69 is formed by plating (for example, gold plating) with the fifth mask M5 left. The second plated metal layer 69 grows on the second seed metal layer 67 and does not grow on the fifth mask M5. Removing the fifth mask M5 after the formation of the second plated metal layer 69 can leave the second seed metal layer 67 and the second plated metal layer 69 on the first plated metal layer 65 and the second dielectric film 57.

The above steps bring the first and second metal bodies 21 and 23, which are located on the first and second semiconductor mesas 15 and 17, to completion. The first and second metal bodies 21 and 23 each are provided with the metal layer 61, the first seed metal layer 63 and the first plated metal layer 65, and the metal layer 61, the second seed metal layer 67 and the second plated metal layer 69, respectively, and are stacked on the respective semiconductor mesas. The first and second metal bodies 21 and 23 delimit the embedding region 60 on both sides of the MMI semiconductor mesa 13 in the direction of the second axis.

If necessary, a passivation film 35 is formed on the entire surface of the substrate after the first and second metal bodies 21 and 23 are formed. The passivation film 35 covers all the faces of the first and second metal bodies 21 and 23 except for the bottom faces thereof. These steps bring the multimode interference device 11 to completion. Electrodes for a Mach-Zehnder modulator can be formed in accordance with process steps in the method for fabricating a multimode interference device according to the present embodiment that are described with reference to FIGS. 5A to 8B, thereby producing a multimode interference device and a Mach-Zehnder modulator.

A description will be given of a method for fabricating a multimode interference device in an example according to the embodiment with reference to FIGS. 9A to 11B. FIGS. 9A to 11B are cross-sectional views each showing a major step in a method of fabricating a Mach-Zehnder modulator, more specifically in a method for fabricating a multimode interference device which will be described with reference to these figures. To facilitate understanding, reference numerals used in the description made with reference to FIGS. 1 to 4B are used in the following description, where possible.

After the MMI semiconductor mesa 13 and the first and second semiconductor mesas 15 and 17 are fabricated in the steps shown in FIG. 5B and figures prior thereto, the first dielectric film 53 is grown, as shown in FIG. 9A, so as to cover the semiconductor face 51f, the MMI semiconductor mesa 13, and the first and second semiconductor mesas 15 and 17. In this example, the first dielectric film 53 is grown on the entire face of the substrate product. The first dielectric film 53 may include a silicon-based inorganic insulating film, such as silicon nitride (SiON), and the silicon-based inorganic insulating film is formed, for example, by chemical vapor deposition.

Resin 71 is formed to bury the semiconductor surface 51f, the MMI semiconductor mesa 13, and the first and second semiconductor mesas 15 and 17. Specifically, resin, such as a BCB resin, is applied to the first dielectric film 53 by coating. The applied resin is cured by heat treatment into a cured resin. The cured resin has a thickness, defined on the semiconductor face 51f, enough to cover the top and side faces of the MMI semiconductor mesa 13 and the first and second semiconductor mesas 15 and 17.

A first mask N1 to define an opening formed in the resin 71 is formed on the cured resin. The first mask N1 has a first opening N1OP1 and a second opening N1OP2, which are located on the first and second semiconductor mesas 15 and 17, respectively. The cured resin is etched with the first mask N1 to form a resin body, which has been already referred to as the resin 71, having a first opening R1OP and a second opening R2OP. The first and second openings R1OP1 and R1OP2 reach the first dielectric film 53, which is disposed on the first and second semiconductor mesas 15 and 17, and expose the first dielectric film 53 thereat. The first mask N1 may include, for example, resist. The first mask N1 is removed after the formation of the resin 71.

After forming the resin 71 which provided with the first and second openings R1OP1 and R1OP2, as shown in FIG. 9B, a second mask N2 is formed on the resin 71, and the second mask N2 defines openings to be formed in the first dielectric film 53. Specifically, the second mask N2 has a first opening N2OP1 and a second opening N2OP2, which are located on the first and second semiconductor mesas 15 and 17, respectively. The first dielectric film 53 is etched with the second mask N2 to form a first opening R2OP1 and a second opening R2OP2 in the first dielectric film 53. The first and second openings R2OP1 and R2OP2 reach the respective top faces of the first and second semiconductor mesas 15 and 17 to expose these top faces. The second mask N2 may include, for example, resist. The second mask N2 is removed after the first dielectric film 53 is etched.

After forming the first dielectric film 53 which has the first and second openings R2OP1 and R2OP2, as shown in FIG. 10A, a third mask N3 for lift-off is formed on the resin 71. The third mask N3 has a first opening N3OP1 and a second opening N3OP2, which are located on the first and second semiconductor mesas 15 and 17, respectively, to expose the respective top faces of the first and second semiconductor mesas 15 and 17. The third mask M3 may include, for example, resist.

After forming the third mask M3, a metal layer 61 and 61OF is deposited on the entire surface of the substrate product. The metal layer 61 is formed in the first and second openings N3OP1 and N3OP2, which are on the top faces of the first and second semiconductor mesas 15 and 17, respectively, and the metal layer 61OF is deposited on the third mask N3. Removing the third mask N3 after depositing the metal layers 61 and 61OF by liftoff eliminates the metal layer 61OF along with the third mask N3, and allows the metal layers 61 to remain on the top faces of the first and second semiconductor mesas 15 and 17, and the metal layers 61 make contact with these top faces.

As shown in FIG. 10B, a second dielectric film 73 is deposited on the entire face of the substrate product after the metal layer 61 is formed. The second dielectric film 73 may include a silicon-based inorganic insulating film, such as SiON, and covers the metal layer 61 and the resin 71.

As shown in FIG. 11A, a fourth mask N4 is formed on the second dielectric film 73 after the second dielectric film 73 is formed. The fourth mask N4 defines openings on the metal layer 61. Specifically, the fourth mask N4 has a first opening N4OP1 and a second opening N4OP2. The first and second openings N4OP1 and N4OP2 each are located on the metal layer 61 which is disposed on each of the first and second semiconductor mesas 15 and 17. The second dielectric film 73 is etched with the fourth mask N4 to form a first opening R3OP1 and a second opening R3OP2 in the second dielectric film 73. The first and second openings R3OP1 and R3OP2 each extend to the metal layer 61 on each of the first and second semiconductor mesas 15 and 17 to expose the metal layer 61. The fourth mask N4 may include, for example, resist. The fourth mask N4 is removed after etching the second dielectric film 73.

As seen from the above description, the processes in the steps shown in FIGS. 9A to 11B bring an embedding region 60 to completion. Specifically, the embedding region 60 is provided by the formation of the first dielectric film 53, the resin 71 and the second dielectric film 73, the formation of the first and second openings R1OP1 and R1OP2, the formation of the first and second openings R2OP1 and R2OP2, and the formation of the first and second openings R3OP1 and R3OP2.

As shown in FIG. 11B, a fifth mask N5 to define the upper metal body is formed on the second dielectric film 73 after the first and second openings R3OP1 and R3OP2 are formed in the second dielectric film 73. The fifth mask N5 has a first opening N5OP1 and a second opening N5OP2. The first and second openings N5OP1 and N5OP2 each are located on the metal layer 61, which is disposed on each of the first and second semiconductor mesas 15 and 17, to expose the metal layer 61 thereat. The fifth mask N5 may include, for example, a thick film of resist.

After forming the fifth mask N5, a seed metal layer 75, such as Ti/Au, is deposited on the entire surface of the substrate product. With the fifth mask N5 left, metal for a metal layer 77 is formed by plating (for example, gold plating) on the seed metal layer 75. The metal layer 77 grows on the seed metal layer 75 and does not grow on the fifth mask N5. Removing the fifth mask N5 after plating metal for the plated metal layer 77 on the seed metal layer 75 leaves the plated metal layer 77 on the second dielectric film 73.

The above steps bring the stacks of the first and second metal bodies 21 and 23 and the first and second semiconductor mesas 15 and 17 to completion. The first and second metal bodies 21 and 23 each include a metal layer 61, a seed metal layer 75, and a plated metal layer 77. The first and second metal bodies 21 and 23 delimit the embedding region 60 on both sides of the MMI semiconductor mesa 13 in the direction of the second axis.

If necessary, a passivation film 35 is formed on the entire surface of the substrate product after the first and second metal bodies 21 and 23 are formed, and covers all the faces of the first and second metal bodies 21 and 23 except for the bottom faces thereof. The above steps bring a multimode interference device 11 to completion. Electrodes for a Mach-Zehnder modulator can be formed in accordance with process steps in a method of fabricating a multimode interference device according to the present embodiment that are described with reference to FIGS. 9A to 11B, thereby fabricating a semiconductor optical device including a multimode interference device and a Mach-Zehnder modulator.

Referring again to FIG. 1, the MMI semiconductor mesa 13 is connected to multiple waveguide mesas at the first and second end faces 13a and 13b. As understood from the above description, the MMI semiconductor mesa 13 is buried by the embedding region 19, so that the embedding region 19 covers the faces of the MMI semiconductor mesa 13. The embedding region 19 that covers the MMI semiconductor mesa 13 exerts stress on the MMI semiconductor mesa 13. The inventor's findings reveal that unevenness in stress produced by resin which embeds the MMI semiconductor mesa 13 results in unevenness in the refractive index in the MMI semiconductor mesa 13. FIGS. 12A and 13A show the planar shapes of models MMI(R) and MMI(L) for simulation of 2×2 MMIs.

Size of the MMI mesa of a 2×2 multimode interferometer
Width WD: 20 micrometers
Longitudinal LG: 550 micrometers
Refractive index of semiconductor of the MMI mesa: 3.5
Model MMI(R):
In order to show that imbalance in stress in the MMI semiconductor mesa causes the right region thereof to have a refractive index lower than that of the left region, the MMI semiconductor mesa is provided with an additional region (0.15 times of the full width WD) of a low refractive index (refractive index difference: −0.002) on the right side.
Model MMI (L):
In order to show that imbalance in stress in the MMI semiconductor mesa causes the left region to have a refractive index lower than that of the right region, the MMI semiconductor mesa is provided with an additional region (0.15 times of the full width WD) of a low refractive index (refractive index difference: −0.002) on the left side.
Simulation made: To calculate loss in propagation from the left port of each of models MMI (R) and MMI (L) to the Bar and Cross ports.

Figure 12B:
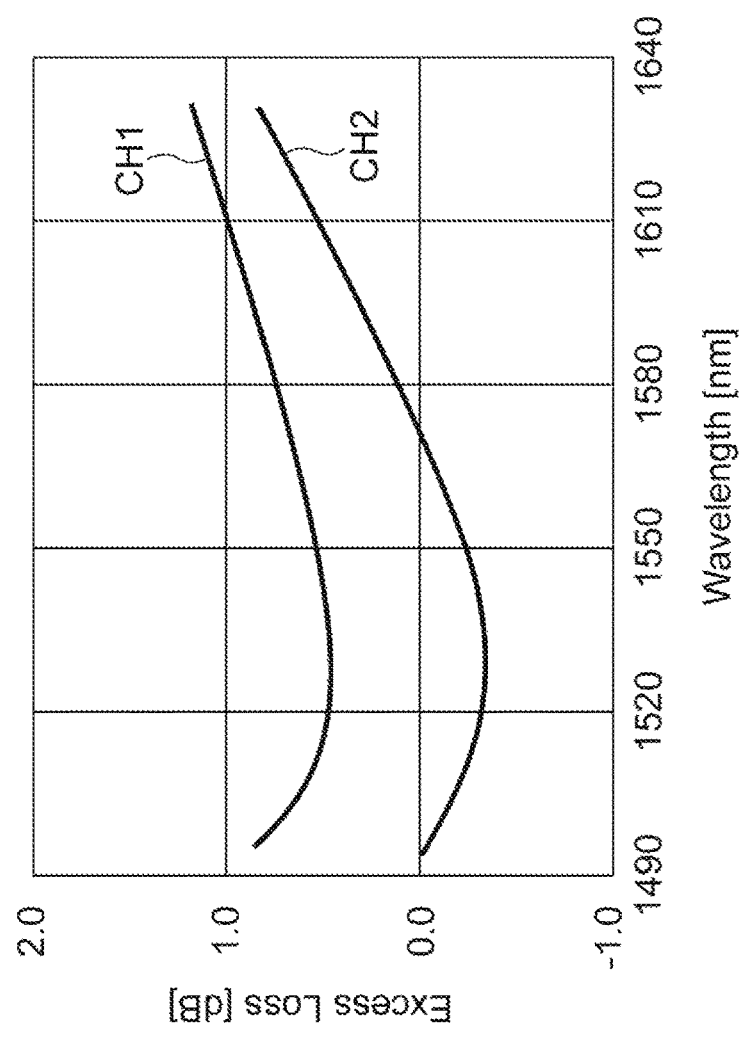
FIG. 12B is a graph showing the loss characteristics, simulated with the model shown in FIG. 12A, of the MMI semiconductor mesa.
Figure 12A:
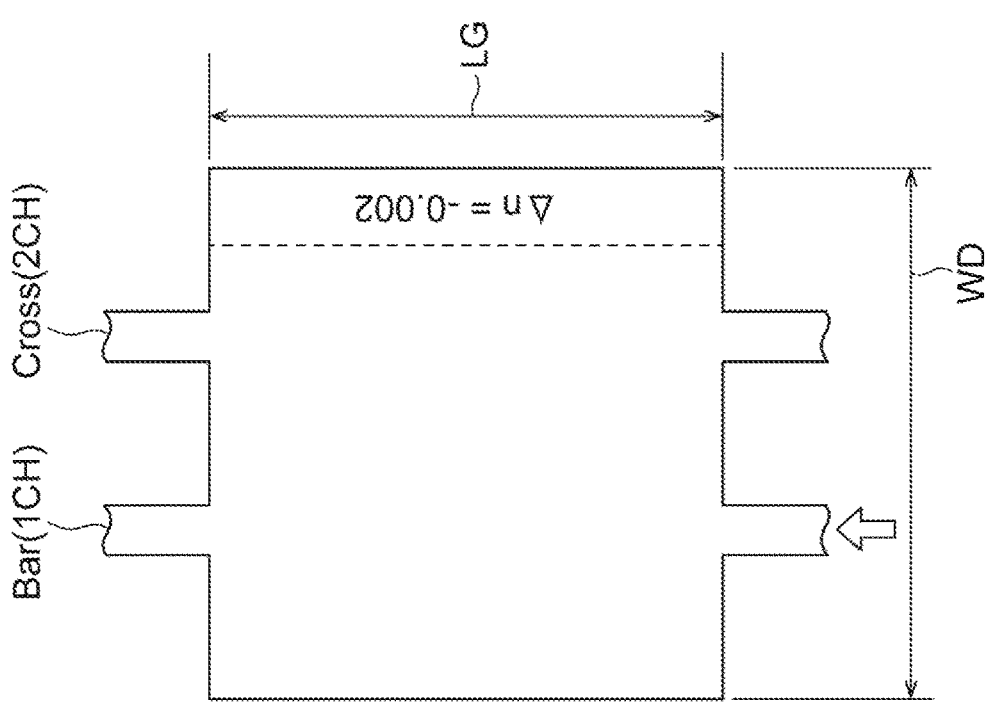
FIG. 12A is a schematic top view illustrating a simulation model of an MMI semiconductor mesa which simulates a difference in stress between both sides of the MMI semiconductor mesa.
Figure 13B:
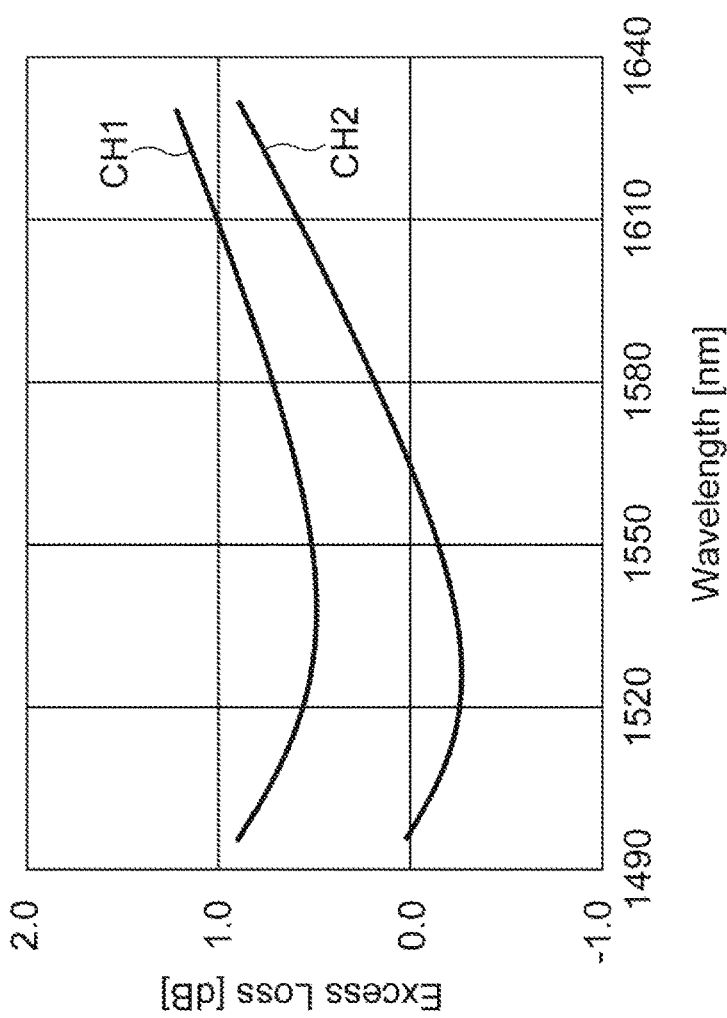
FIG. 13B is a graph showing the loss characteristics, simulated with the model shown in FIG. 13A, of the MMI semiconductor mesa.
Figure 13A:
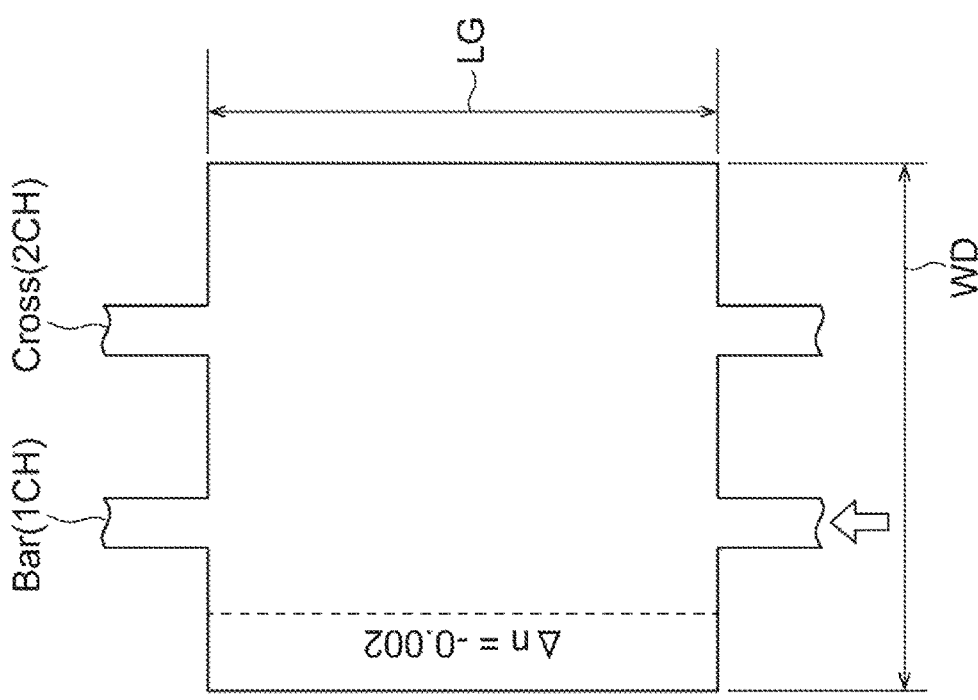
FIG. 13A is a schematic top view illustrating a simulation model of an MMI semiconductor mesa which simulates difference in stress between both sides of the MMI semiconductor mesa.

FIGS. 12B and 13B show measurement characteristics and calculation results of models MMI (R) and MMI (L) for simulation, respectively. The simulation results of model MMI (R) and MMI (L) show that the simulation using the two models that have the respective refractive index distributions on either side of the MMI semiconductor mesa does not change the sign of the deviation of the ports. The simulation exhibits a good agreement with measurement characteristics in the C band (1530 to 1565 nm). One of external factors that cause the distribution of the refractive index in the MMI is, for example, unevenness in stress from the embedding rein region.

As described above, the present embodiment can bring a small deviation to a multimode interference device including the MMI semiconductor mesa surrounded by the resin body.

The present embodiment can provide a Mach-Zehnder modulating device including the multimode interference device.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A multimode interference device comprising:
    a multimode interferometer (MMI) semiconductor mesa for a multimode interferometer, the MMI semiconductor mesa having a first end face, a second end face, a first side face, and a second side face, the first end face and the second end face being arranged in a direction of a first axis, and the first side face and the second side face extending in the direction of the first axis;
    a first semiconductor mesa disposed apart from the first side face of the MMI semiconductor mesa;
    a second semiconductor mesa disposed apart from the second side face of the MMI semiconductor mesa;
    an embedding region covering the MMI semiconductor mesa, the first semiconductor mesa and the second semiconductor mesa, the embedding region having a first opening and a second opening, and the first opening and the second opening being at the first semiconductor mesa and the second semiconductor mesa, respectively;
    a first metal body making contact with the first semiconductor mesa through the first opening; and
    a second metal body making contact with the second semiconductor mesa through the second opening,
    the first end face having multiple first ports,
    the second end face having multiple second ports, and
    the first semiconductor mesa, the MMI semiconductor mesa, and the second semiconductor mesa being arranged in a direction of a second axis intersecting the first axis.

2. The multimode interference device according to claim 1, wherein the MMI semiconductor mesa has a 2×2 structure.

3. The multimode interference device according to claim 1, wherein
    the MMI semiconductor mesa has a laminate structure including an upper semiconductor region, a core layer, and a lower semiconductor region, and
    the first semiconductor mesa and the second semiconductor mesa each have the laminate structure.

4. The multimode interference device according to claim 1, wherein
    the first semiconductor mesa has a side face,
    a distance between the side face of the first semiconductor mesa and the first side face of the MMI semiconductor mesa is two micrometers or more,
    the second semiconductor mesa has a side face, and
    a distance between the side face of the second semiconductor mesa and the second side face of the MMI semiconductor mesa is two micrometers or more.

5. The multimode interference device according to claim 1, wherein
    the first semiconductor mesa has a side face,
    the side face of the first semiconductor mesa is within 20 micrometers from the first side face of the MMI semiconductor mesa,
    the second semiconductor mesa has a side face, and
    the side face of the second semiconductor mesa is within 20 micrometers from the second side face of the MMI semiconductor mesa.

6. The multimode interference device according to claim 1, wherein
    the embedding region includes a first resin body, an inorganic insulating interlayer film, and a second resin body, and
    the inorganic insulating interlayer film is between the first resin body and the second resin body.

7. The multimode interference device according to claim 1, wherein
    the embedding region includes a first inorganic insulating film and a resin body,
    the first inorganic insulating film is in contact with a top face, the first side face and the second side face of the MMI semiconductor mesa, a top face and a side face of the first semiconductor mesa, and a top face and a side face of the second semiconductor mesa, and
    the resin body covers the top face, the first side face and the second side face of the MMI semiconductor mesa, the top face and the side face of the first semiconductor mesa, and the top face and the side face of the second semiconductor mesa.

* * * * *